(12) United States Patent
Peck, Jr.

(10) Patent No.: US 9,651,633 B2
(45) Date of Patent: *May 16, 2017

(54) MAGNETIC CORE FLUX SENSOR

(71) Applicant: THE BOEING COMPANY, Chicago, IL (US)

(72) Inventor: James Leo Peck, Jr., Huntington Beach, CA (US)

(73) Assignee: The Boeing Company, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/229,344

(22) Filed: Mar. 28, 2014

(65) Prior Publication Data

US 2014/0232384 A1 Aug. 21, 2014

Related U.S. Application Data

(63) Continuation-in-part of application No. 13/773,135, filed on Feb. 21, 2013.

(51) Int. Cl.
*G01N 27/72* (2006.01)
*H01F 27/25* (2006.01)
(Continued)

(52) U.S. Cl.
CPC .......... *G01R 33/02* (2013.01); *G01R 33/04* (2013.01); *H01F 3/10* (2013.01); *H01F 27/402* (2013.01)

(58) Field of Classification Search
CPC .................................................. G01N 27/72
(Continued)

(56) References Cited

U.S. PATENT DOCUMENTS 352,105 A 11/1886 Zipebnowsky
2,411,374 A * 11/1946 Horstman ............... 336/213
(Continued)

FOREIGN PATENT DOCUMENTS

CN 2528090 Y 12/2002
CN 1444237 A 9/2003
(Continued)

OTHER PUBLICATIONS

European Patent Office, International Application No. PCT/US2013/072789 International Search Report and Written Opinion dated May 27, 2014, pp. 1-6.
(Continued)

*Primary Examiner* — Bot Ledynh
(74) *Attorney, Agent, or Firm* — Charles L. Moore; Moore & Van Allen PLLC

(57) ABSTRACT

A magnetic core flux sensor assembly may include a flux sensor core portion and an elongated opening for receiving a conductor winding through the flux sensor core portion. The flux sensor core portion may include a width from a perimeter edge of the flux sensor core portion to the elongated opening that is constant. An electrical current flowing through the conductor winding generates a magnetic field about the conductor winding and a magnetic flux flow in the flux sensor core portion. One or more sensor holes may be positioned relative to the elongated opening for sensing the magnetic flux flow at different distances from the elongated opening. A sensor conductor winding may extend through each pair of sensor holes. The magnetic flux flow generates an electrical signal in each sensor conductor winding. The electrical signal corresponds to the magnetic flux flow at a location of the particular sensor conductor winding.

20 Claims, 16 Drawing Sheets

(51) Int. Cl.
*H01F 30/16* (2006.01)
*G01R 33/02* (2006.01)
*G01R 33/04* (2006.01)
*H01F 27/40* (2006.01)
*H01F 3/10* (2006.01)

(58) Field of Classification Search
USPC .......................................................... 324/239
See application file for complete search history.

(56) References Cited

U.S. PATENT DOCUMENTS

| | | | |
|---|---|---|---|
| 2,569,675 A | 10/1951 | Keefe | |
| 2,780,771 A | 2/1957 | Lee | |
| 3,042,849 A | 7/1962 | Dortort | |
| 3,411,121 A | 11/1968 | Twomey | |
| 3,451,130 A * | 6/1969 | Ellis | 29/605 |
| 3,464,002 A | 8/1969 | Hentschel | |
| 4,020,440 A | 4/1977 | Moerman | |
| 4,338,657 A | 7/1982 | Lisin | |
| 4,520,335 A | 5/1985 | Rauch et al. | |
| 4,520,556 A * | 6/1985 | Pasko et al. | 29/606 |
| 4,565,746 A | 1/1986 | Hayase | |
| 4,668,931 A | 5/1987 | Boenitz | |
| 4,684,882 A | 8/1987 | Blain | |
| 4,897,626 A | 1/1990 | Fitter | |
| 5,351,017 A | 9/1994 | Yano | |
| 5,486,756 A | 1/1996 | Kawakami et al. | |
| 5,534,831 A | 7/1996 | Yabuki | |
| 5,534,837 A | 7/1996 | Brandt | |
| 5,668,707 A | 9/1997 | Barrett et al. | |
| 5,737,203 A | 4/1998 | Barrett et al. | |
| 6,144,282 A | 11/2000 | Lee | |
| 6,181,079 B1 | 1/2001 | Chang et al. | |
| 6,715,198 B2 | 4/2004 | Kawakami | |
| 6,995,646 B1 | 2/2006 | Fromm et al. | |
| 7,015,691 B2 | 3/2006 | Kang et al. | |
| 7,023,313 B2 | 4/2006 | Sutardja | |
| 7,071,807 B1 | 7/2006 | Herbert | |
| 7,106,047 B2 | 9/2006 | Taniguchi | |
| 7,148,675 B2 | 12/2006 | Itoh | |
| 7,280,025 B2 | 10/2007 | Sano | |
| 7,307,502 B2 | 12/2007 | Sutardja | |
| 7,342,477 B2 | 3/2008 | Brandt | |
| 7,362,206 B1 | 4/2008 | Herbert | |
| 7,378,828 B2 | 5/2008 | Brandt | |
| 7,407,596 B2 | 8/2008 | Choi et al. | |
| 7,639,520 B1 | 12/2009 | Zansky et al. | |
| 8,497,677 B2 | 7/2013 | Miyahara | |
| 8,980,053 B2 | 3/2015 | Krahn et al. | |
| 9,106,125 B1 | 8/2015 | Brandt et al. | |
| 9,159,487 B2 | 10/2015 | Peck | |
| 2002/0163330 A1 | 11/2002 | Sekiya | |
| 2003/0117251 A1 | 6/2003 | Haugs et al. | |
| 2004/0027121 A1* | 2/2004 | Choi et al. | 324/253 |
| 2004/0051617 A1 | 3/2004 | Buswell | |
| 2004/0124958 A1 | 7/2004 | Watts | |
| 2004/0135661 A1 | 7/2004 | Haugs et al. | |
| 2005/0035761 A1 | 2/2005 | Park et al. | |
| 2005/0093669 A1* | 5/2005 | Ahn et al. | 336/200 |
| 2006/0082430 A1 | 4/2006 | Sutardja | |
| 2006/0089022 A1 | 4/2006 | Sano | |
| 2006/0197480 A1 | 9/2006 | Mori et al. | |
| 2008/0150664 A1 | 6/2008 | Blankenship | |
| 2008/0163475 A1 | 7/2008 | Snyder | |
| 2009/0244937 A1 | 10/2009 | Liu | |
| 2009/0289754 A1 | 11/2009 | Shpiro et al. | |
| 2010/0134044 A1 | 6/2010 | Sin | |
| 2010/0134058 A1 | 6/2010 | Nagashima et al. | |
| 2010/0164673 A1 | 7/2010 | Shim | |
| 2010/0194373 A1 | 8/2010 | Hamberger et al. | |
| 2011/0095858 A1* | 4/2011 | Spurny | 336/221 |
| 2011/0163834 A1 | 7/2011 | Stahmann et al. | |
| 2011/0210722 A1 | 9/2011 | Paci et al. | |
| 2011/0279100 A1 | 11/2011 | Ikriannikov | |
| 2011/0279212 A1 | 11/2011 | Ikriannikov et al. | |
| 2012/0150679 A1 | 6/2012 | Lazaris | |
| 2012/0226386 A1 | 9/2012 | Kulathu et al. | |
| 2012/0315792 A1* | 12/2012 | Costello | 439/620.01 |
| 2013/0043725 A1 | 2/2013 | Birkelund | |
| 2013/0049751 A1 | 2/2013 | Hamberger et al. | |
| 2014/0022040 A1 | 1/2014 | Peck | |
| 2014/0210585 A1 | 7/2014 | Peck, Jr. | |
| 2014/0232384 A1 | 8/2014 | Peck, Jr. | |
| 2015/0043119 A1 | 2/2015 | Peck, Jr. | |

FOREIGN PATENT DOCUMENTS

| | | |
|---|---|---|
| CN | 1495435 A | 5/2004 |
| CN | 1514258 A | 7/2004 |
| CN | 1577647 A | 2/2005 |
| CN | 1615462 A | 5/2005 |
| CN | 1637969 A | 7/2005 |
| CN | 1763872 A | 4/2006 |
| CN | 101995507 A | 3/2011 |
| DE | 2926423 A1 | 1/1981 |
| DE | 4129265 A1 | 3/1993 |
| EP | 1345036 A2 | 9/2003 |
| EP | 2688076 A2 | 1/2014 |
| JP | 01242333 A | 9/1989 |
| JP | 02192705 A | 7/1990 |
| JP | 09-077452 A | 3/1997 |
| JP | 2001167933 A | 6/2001 |
| JP | 2011238653 A | 11/2011 |
| WO | 2007078403 A2 | 7/2007 |
| WO | 2014130122 A1 | 8/2014 |

OTHER PUBLICATIONS

The Boeing Company; International Preliminary Report on Patentability for International Application No. PCT/US2013/072789 dated Aug. 25, 2015, 9 Pages.
Fedder, Gary K., et al.; "Laminated High-Aspect-Ratio Microstructures in a Conventional CMOS Process," Proceedings of the IEEE Micro Electro Mechanical Systems Workshop, 1996, pp. 13-18.
Chee, Clinton Y.K., et al.; "A Review on the Modelling of Piezoelectric Sensors and Actuators Incorporated in Intelligent Structures," Journal of Intelligent Material Systems and Structures, 1998, pp. 3-19, vol. 9.
Wilson, Earl J.; "Strain-Gage Instrumentation," Harris' Shock and Vibration Handbook, 2002, pp. 17.1-17.15, Chapter 17, 5th Edition.
Simoes Moita, Jose M., et al.; "Active control of adaptive laminated structures with bonded piezoelectric sensors and actuators," Computers and Structures, 2004, pp. 1349-1358, vol. 82.
European Patent Office, European Patent Application No. 14178702.8, European Search Report dated Jan. 21, 2015, 7 pages.
European Patent Office; Extended European Search Report for European Patent Application No. 14179801.7 dated Jul. 10, 2015, 14 Pages.
European Patent Office; Extended European Search Report for European Patent Application No. 13173067.3 dated Nov. 3, 2015, 9 Pages.
Chinese Patent Office; Office Action for Chinese Patent Application No. 201310299638.5 dated May 27, 2016, 37 Pages.
Chinese Patent Office; Office Action for Chinese Patent Application No. 2013800736555 dated Aug. 26, 2016, 16 Pages.

* cited by examiner

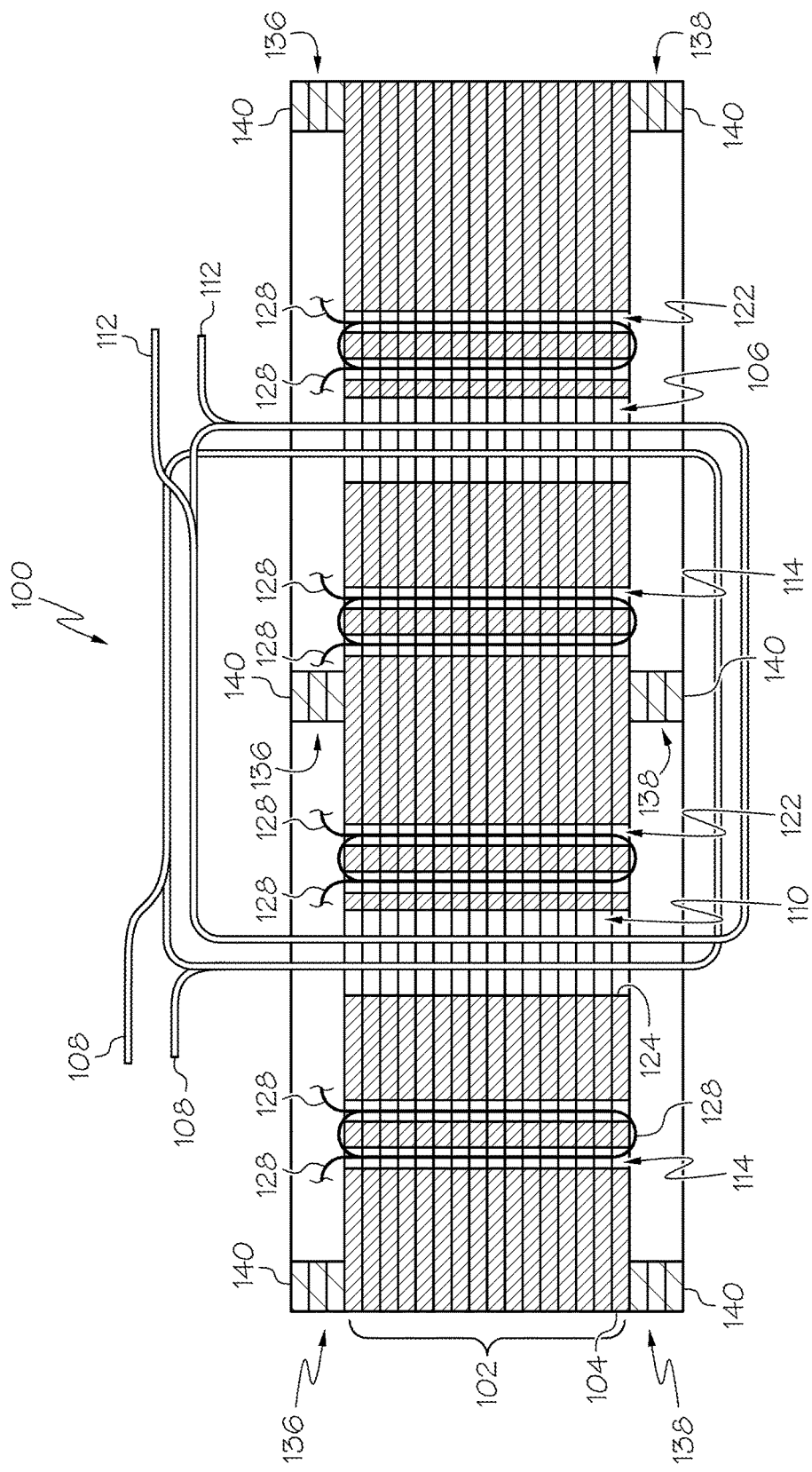

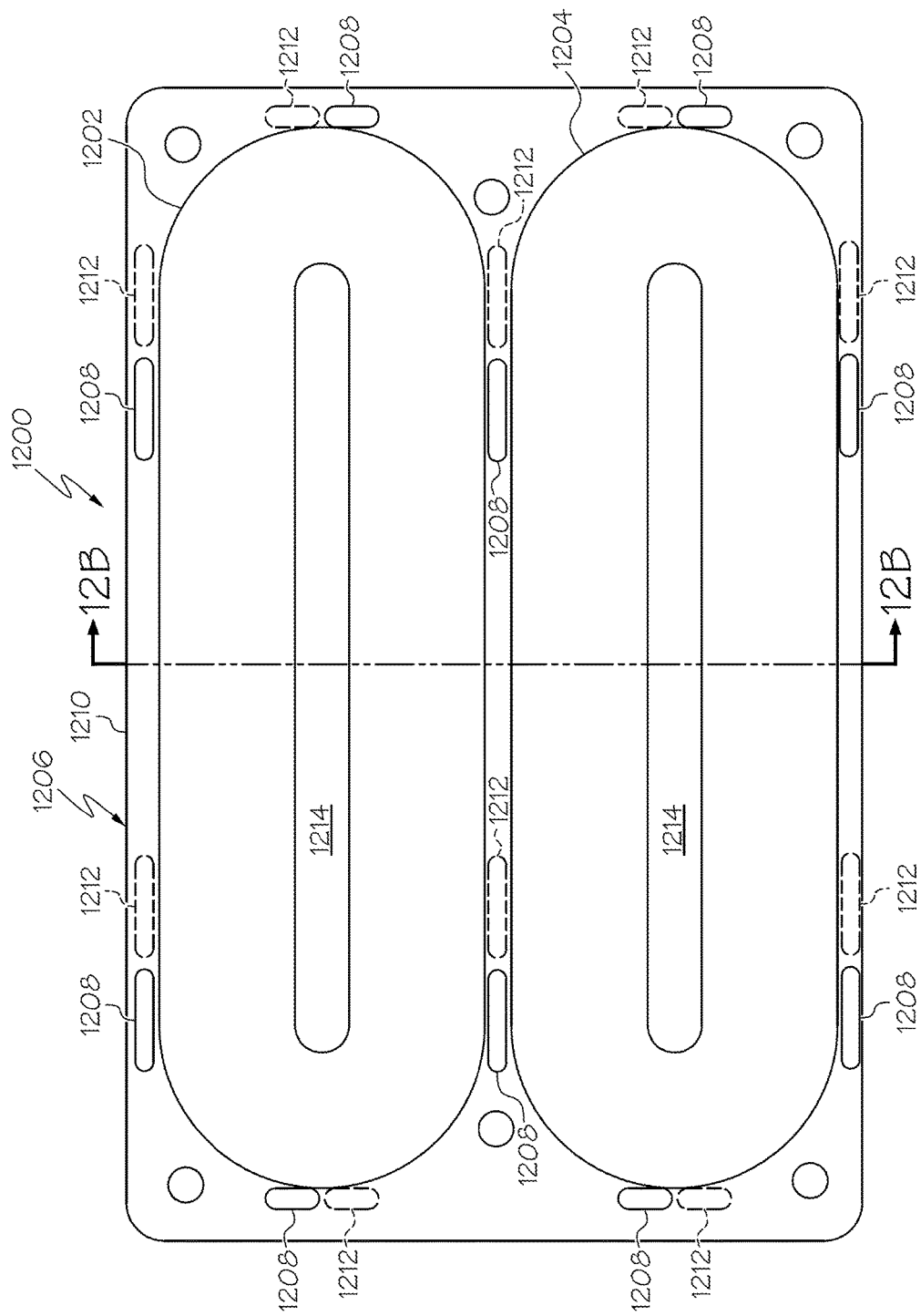

MAGNETIC CORE FLUX SENSOR

CROSS-REFERENCE TO RELATED APPLICATIONS

The present application is related to U.S. patent application Ser. No. 13/553,267, filed Jul. 19, 2013, now U.S. Pat. No. 9,159,487, entitled "Linear Electromagnetic Device" which is assigned to the same assignee as the present application.

The present application is also related to U.S. patent application Ser. No. 13/953,314, filed Jul. 29, 2013, entitled "Transformer Core Flux Control for Power Management" which is assigned to the same assignee as the present application.

The present application is also related to U.S. patent application Ser. No. 13/962,441, filed Aug. 8, 2013, entitled "Electrical Power Distribution Network Monitoring and Control" which is assigned to the same assignee as the present application.

The present application is a continuation-in-part of U.S. patent application Ser. No. 13/773,135, entitled "Magnetic Core Flux Sensor" filed Feb. 21, 2013 which is assigned to the assignee as the present application and is incorporated herein in its entirety by reference.

FIELD

The present disclosure relates to electromagnetic devices, such as electrical transformers and inductors, and more particularly to a magnetic core flux sensor and method for measuring magnetic flux within a core of a transformer, inductor or similar device.

BACKGROUND

Electromagnetic devices, such as inductors, transformers and similar devices include magnetic cores in which a magnetic flux flow may be generated in response to an electrical current flowing through a conductor winding associated with the magnetic core. The magnetic flux flow in a magnetic core may be estimated using techniques such as finite element analysis or similar techniques; however such methods are not a direct method of measuring the flux in a core. Accordingly, magnetic cores may be overdesigned or may be made larger than necessary for some applications. This can result in excess weight and volume of such devices. The excess weight and volume can be an important consideration when these electromagnetic devices are used in certain applications, such as for example on vehicles such as aircraft, aerospace vehicles or other vehicles where weight and size may be important.

An understanding of the flow or pattern of saturation in a magnetic core may also be helpful information in designing such electromagnetic devices. Whether a particular core design saturates as one body or if the saturation is time-based may be useful. For example, at any one moment in time, there is a boundary in the core material where the material may be saturated on one side of the boundary and non-saturated on the other side of the boundary. Knowledge of the saturation pattern may directly affect the design and implementation of magnetic components and such understanding may best be obtained by directly measuring the magnetic flux in the core. Accordingly, there is a need for being able to directly measure the flux within the core component of an electromagnetic device, such as an inductor, transformer or similar device.

Additionally, magnetic cores require substantially large continuous laminations or plates capable of containing two or more slots to allow space for the windings plus volume and surface area to support magnetic flux storage from two or more magnetic circuits. This configuration can present thermal management concerns. When the magnetic core is driven hard, heat builds up in the core. There is limited surface area to support cooling in the core. Additionally, there is limited ability to arrange the core to support physical constraints, volume, shape and size for space and thermal requirements.

SUMMARY

In accordance with an embodiment, a magnetic core flux sensor assembly may include a flux sensor core portion and an elongated opening for receiving a conductor winding through the flux sensor core portion. The flux sensor core portion may include a width from a perimeter edge of the flux sensor core portion to the elongated opening that is constant about a perimeter of the flux sensor core portion. An electrical current flowing through the conductor winding generates a magnetic field about the conductor winding and a magnetic flux flow about the elongated opening in the flux sensor core portion. The magnetic core flux sensor assembly may also include one or more pairs of sensor holes positioned relative to the elongated opening. The one or more pairs of sensor holes may be configured for preventing significant disruption of the magnetic flux flow in the flux sensor core portion and for use in sensing the magnetic flux flow at a predetermined distance or different distances from the elongated opening. A sensor conductor winding is provided through each pair of sensor holes. The magnetic flux flow generates an electrical signal in each sensor conductor winding. The electrical signal in a particular sensor conductor winding corresponds to the magnetic flux flow at a location of the particular sensor conductor winding.

In accordance with another embodiment, an electromagnetic device may include a magnetic core portion and an elongated opening for receiving a conductor winding through the magnetic core portion. The magnetic core portion includes a predetermined width from a perimeter edge of the magnetic core portion to the elongated opening that is constant about a perimeter of the magnetic core portion. An electrical current flowing through the conductor winding generates a magnetic field about the conductor winding and a magnetic flux flow about the elongated opening in the magnetic core portion.

In accordance with another embodiment, an electromagnetic device may include a first magnetic core assembly. The first magnetic core assembly may include a flux sensor core portion and an elongated opening for receiving a primary conductor winding and a secondary conductor winding through the flux sensor core portion. The flux sensor core portion may include a predetermined width from a perimeter edge of the flux sensor core portion to the elongated opening that is constant about a perimeter of the flux sensor core portion. An electrical current flowing through the primary conductor winding generates a magnetic field about the primary conductor winding and a magnetic flux flow about the elongated opening in the flux sensor core portion. One or more pairs of sensor holes are positioned relative to the elongated opening. The one or more pairs of sensor holes are configured for preventing significant disruption of the magnetic flux flow in the flux sensor core portion and for use in sensing the magnetic flux flow at a distance or different distances from an edge of the elongated opening. A sensor conductor winding passes through each pair of sensor holes. The magnetic flux flow generates an electrical signal in each sensor conductor winding. The electrical signal in a particular sensor conductor winding corresponds to the magnetic flux flow at a location of the particular sensor conductor winding. A first spacer portion and a second spacer portion are each respectively disposed on opposite sides of the flux sensor core portion. Each spacer portion includes an opening. The primary conductor winding and the secondary conductor winding pass through the opening in each spacer portion. A first magnetic core portion is disposed on the first spacer portion and a second magnetic core portion disposed on the second spacer portion. The elongated opening extends through the first and second magnetic core portions. The primary conductor winding and the secondary conductor winding each extending through the first and second magnetic core portions. Each magnetic core portion includes the predetermined width from a perimeter edge of the magnetic core portion to the elongated opening that is constant about a perimeter of the magnetic core portion. At least one of the spacer portions may include a gap for the sensor conductor winding through each pair of sensor holes to pass to connect to a device for detecting the magnetic flux flow at the location of each sensor conductor winding.

In accordance with further embodiment, a method for measuring a magnetic flux in an electromagnetic device may include providing a magnetic core flux sensor assembly including a flux sensor core portion and an elongated opening for receiving a conductor winding through the flux sensor core portion. The flux sensor core portion includes a width from a perimeter edge of the flux sensor core portion to the elongated opening that is constant about a perimeter of the flux sensor core portion. An electrical current flowing through the conductor winding generates a magnetic field about the conductor winding and a magnetic flux flow about the elongated opening in the flux sensor core portion. The method may also include providing one or more pairs of sensor holes positioned relative to the elongated opening. The one or more pairs of sensors holes may be configured for preventing significant disruption of the magnetic flux flow in the flux sensor core portion and for use in sensing the magnetic flux flow at a distance or different distances from an edge of the elongated opening. The method may additionally include providing a sensor conductor winding through each pair of sensor holes. The magnetic flux flow generates an electrical signal in each sensor conductor winding. The electrical signal in a particular sensor conductor winding corresponds to the magnetic flux flow at a location of the particular sensor conductor winding.

BRIEF DESCRIPTION OF THE SEVERAL VIEWS OF DRAWINGS

The following detailed description of embodiments refers to the accompanying drawings, which illustrate specific embodiments of the disclosure. Other embodiments having different structures and operations do not depart from the scope of the present disclosure.

FIG. 1 is a side cross-sectional view of an example of a magnetic core flux sensor assembly in accordance with an embodiment of the present disclosure.

FIG. 12A is a top view of an example of an electromagnetic device in accordance with an embodiment of the present disclosure.

DESCRIPTION

Figure 2A:
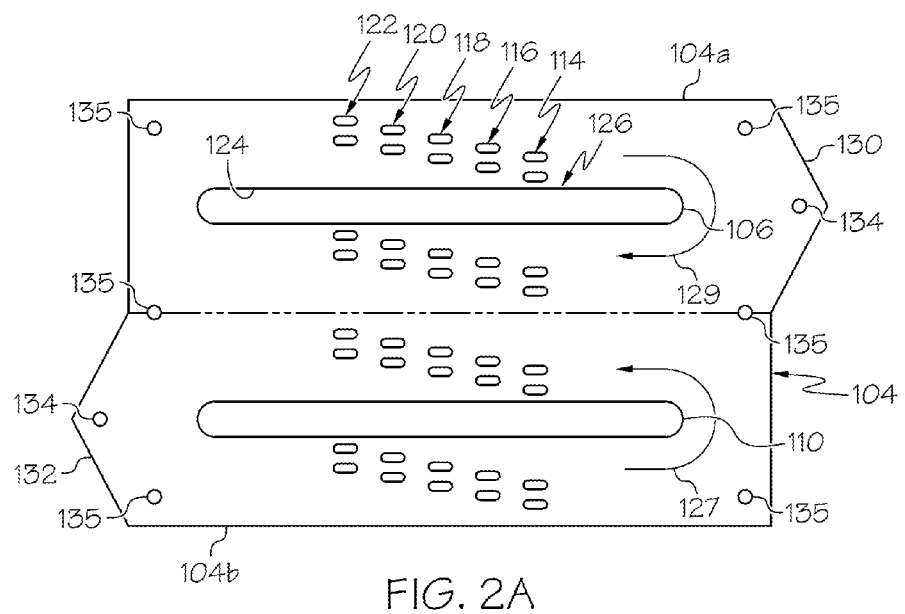
FIG. 2A is a top view of an example of a magnetic flux sensor plate or laminate in accordance with an embodiment of the present disclosure.

The following detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings.

In accordance with an embodiment of the present disclosure, a linear inductor is an electromagnetic device having only one electrical conductor wire winding or windings passing through a magnetic core. In accordance with another embodiment, a linear transformer is a magnetic device where a linear primary electrical conductor wire winding or windings and one or more linear secondary electrical conductors wire winding or windings pass through a magnetic core. The core may be one piece and no turns of the primary and secondary electrical conductors about the core are required. While the core may be one piece, the one piece core may be formed from a plurality of stacked plates or laminates. A current may be conducted through the primary. A magnetic flux from the current in the primary is absorbed by the core. When the current in the primary decreases the core transmits an electromotive force (desorbs) into the secondary wires. A feature of the linear transformer is the linear pass of the primary and secondary conductors through the core. One core may be used as a standalone device or a series of two or more cores may be used where a longer linear exposure is required. Another feature of this transformer is that the entire magnetic field or at least a substantial portion of the magnetic field generated by the current in the primary is absorbed by the core, and desorbed into the secondary. The core of the transformer may be sized or include dimensions so that substantially the entire magnetic field generated by the current is absorbed by the core and so that the magnetic flux is substantially completely contained with the core. This forms a highly efficient transformer with very low copper losses, high efficiency energy transfer, low thermal emission and very low radiated emissions. Additionally the linear transformer is a minimum of 50% lower in volume and weight then existing configurations. Linear electromagnetic devices, such as linear transformers, inductors and similar devices are described in more detail in U.S. patent application Ser. No. 13/553,267, filed Jul. 19, 2012, now U.S. Pat. No. 9,159,487, entitled "Linear Electromagnetic Device" which is assigned to the same assignee as the present application and is incorporated herein in its entirety by reference. A magnetic core flux sensor assembly, as described herein, may be incorporated in a linear electromagnetic device, such as one of those described in the U.S. patent application Ser. No. 13/553,267, now U.S. Pat. No. 9,159,487, for directly detecting and measuring the magnetic flux flow within a magnetic core of such devices or magnetic core flux sensor assembly component of such devices.

Figure 2B:
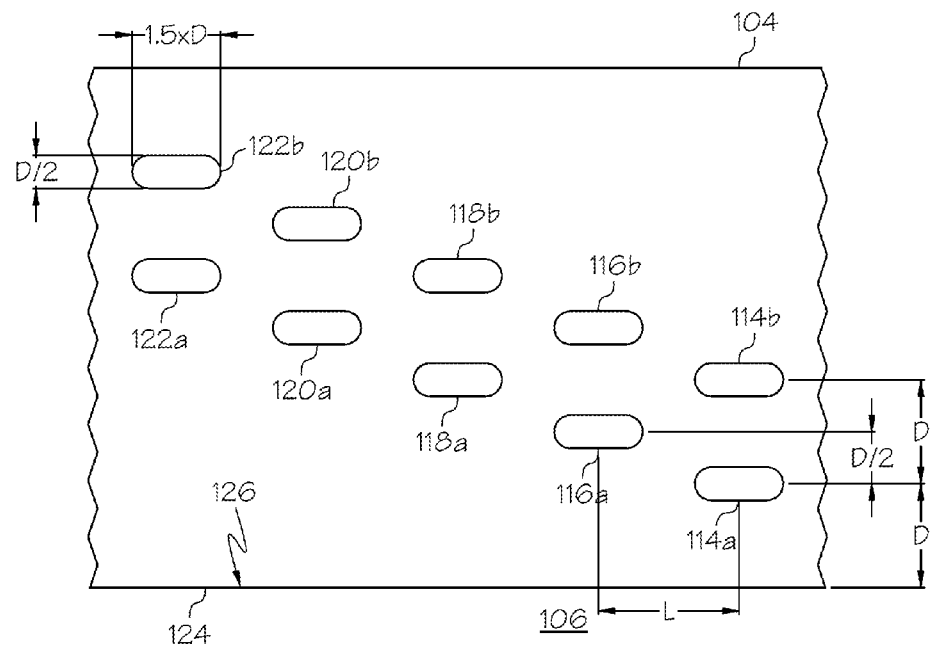
FIG. 2B is a partial view of the exemplary magnetic flux sensor plate or laminate of FIG. 2A showing a detail of the sensor holes in accordance with an embodiment of the present disclosure.

FIG. 1 is a cross-sectional view of an example of a magnetic core flux sensor assembly 100 in accordance with an embodiment of the present disclosure. The magnetic core flux sensor assembly 100 may include a flux sensor core portion 102. The flux sensor core portion 102 may include a plurality of flux sensor core plates 104 or laminates that are stacked on one another. Referring also to FIG. 2A, FIG. 2A is a top view of an example of a magnetic flux sensor plate 104 or laminate in accordance with an embodiment of the present disclosure. FIG. 2B is a partial view of the exemplary magnetic flux sensor plate 104 or laminate of FIG. 2A showing a detail of the sensor holes 114-122 in each sensor plate 104 in accordance with an embodiment of the present disclosure. The plates 104 may be made from a material capable of absorbing a magnetic flux. For example, the plates 104 may be made from silicon steel alloy, a nickel-iron alloy or other metallic material capable of absorbing a magnetic flux similar to that described herein. In an embodiment, the core 102 may be a nickel-iron alloy including about 20% by weight iron and about 80% by weight nickel. The plates 104 may be substantially square or rectangular, or may be some other geometric shape depending on the application of the electromagnetic device and the environment where the electromagnetic device may be located. The plates 104 may be substantially square or rectangular in that the plates may not be perfectly square or rectangular. For example, the sides of the plates 104 may not meet at right angles and opposite sides may not be parallel to one another. The plates 104 may have protruding ends similar to that illustrated in FIG. 6B. The plates may have rounded edges or may be semicircular on the ends similar to that described with reference to FIGS. 7-10.

Figure 4A:
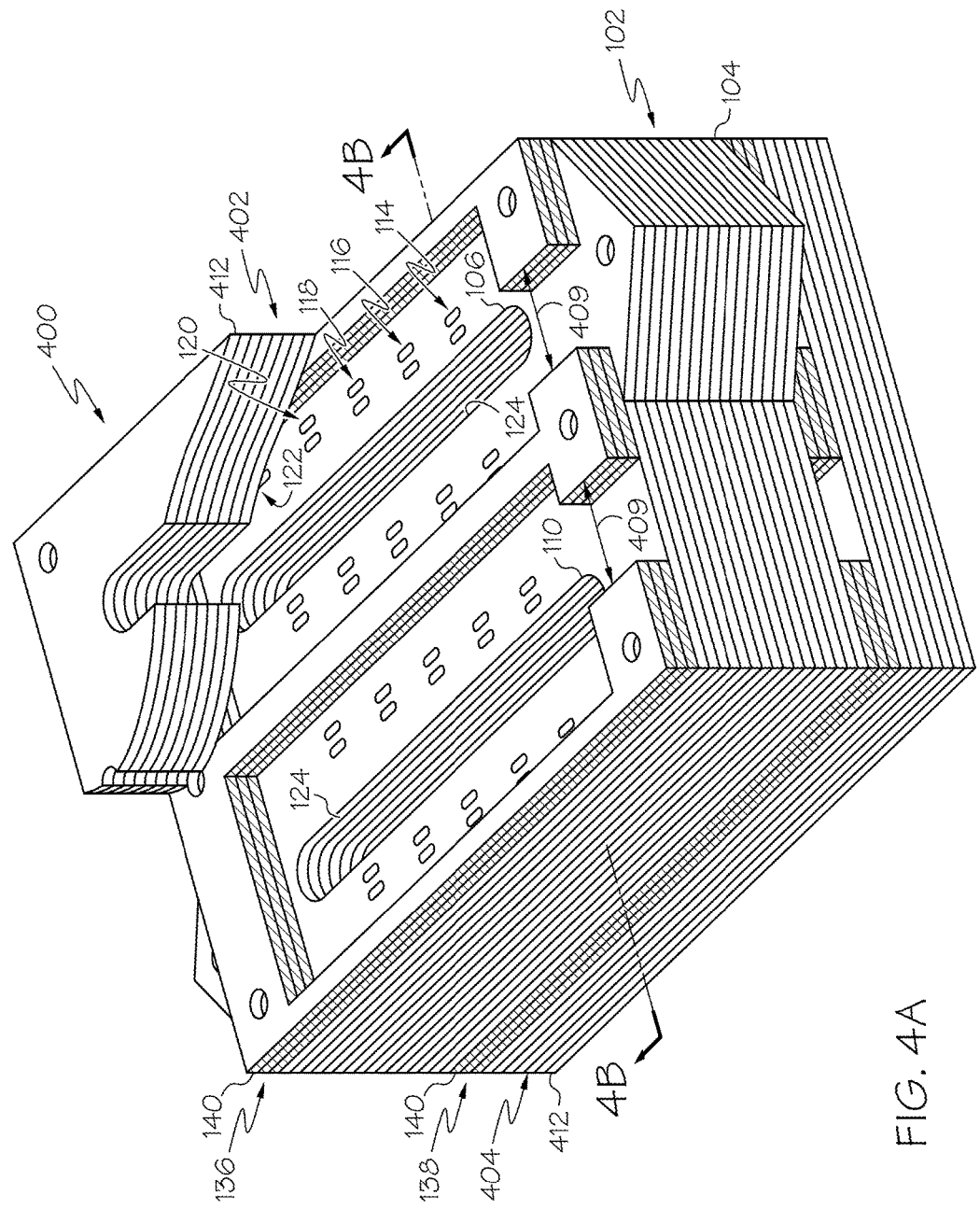
FIG. 4A is a perspective view of an example of a transformer assembly with a portion of the upper magnetic core cut-away to show an exemplary core flux portion sensor assembly in accordance with an embodiment of the present disclosure.
Figure 4B:
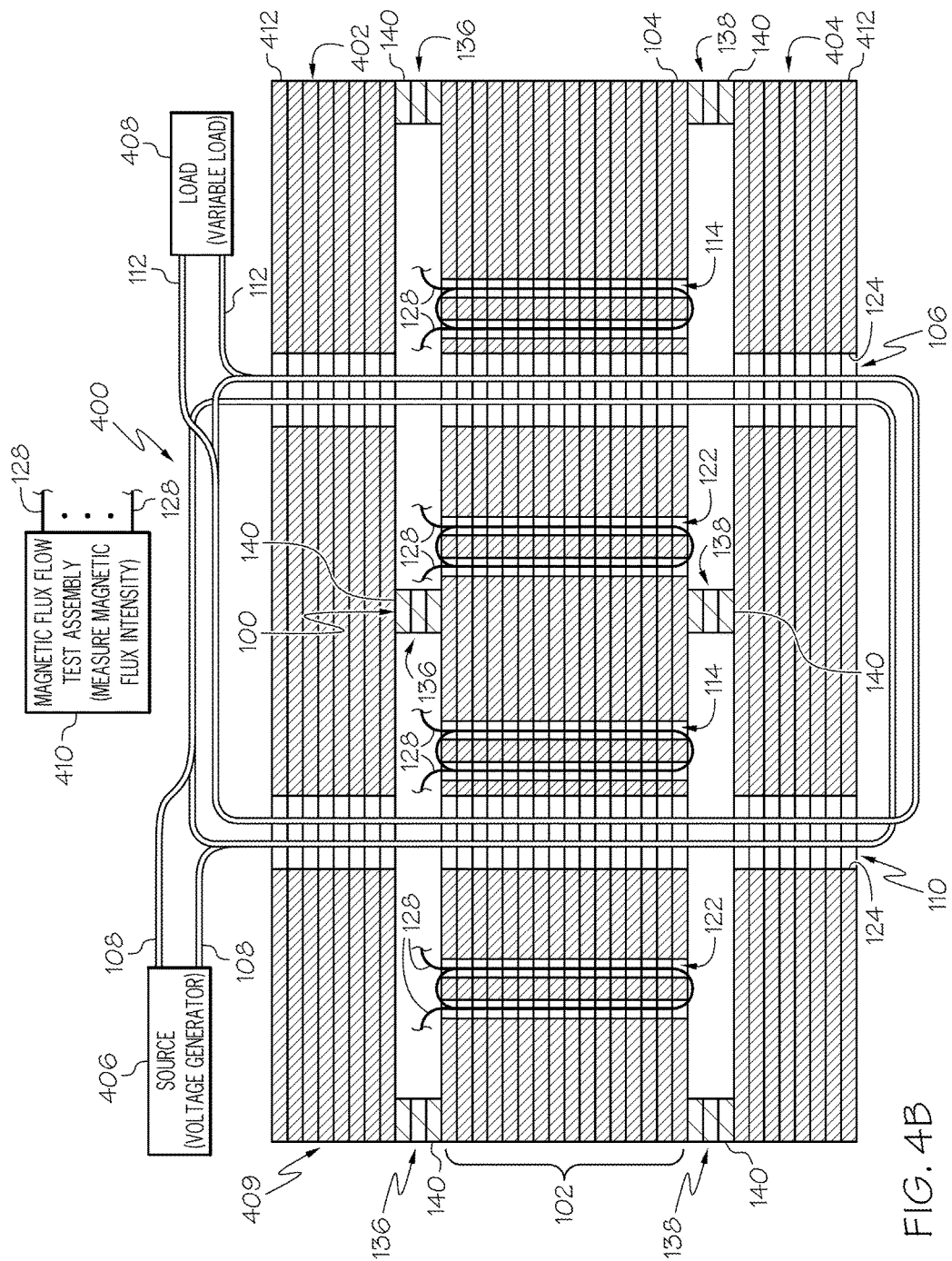
FIG. 4B is a side cross-sectional view taken along lines 4A-4A of the exemplary transformer assembly of FIG. 4A.

The magnetic core flux sensor assembly 100 may also include at least one elongated opening 106 or winding opening for receiving a conductor winding 108 or windings through the flux sensor core portion 102. The exemplary magnetic core flux sensor assembly 100 in FIG. 1 and the flux sensor plate 104 in FIG. 2A may be configured for use in a transformer type electromagnetic device or an inductor type electromagnetic device. An example of a transformer electromagnetic device will be described with reference to FIGS. 4A-4B. In the example of FIGS. 4A-4B, the magnetic core flux sensor assembly 100 and flux sensor plate 104 each include a second elongated opening 110. Each of the elongated openings 106 and 110 may receive a primary conductor winding 108 or windings and at least a secondary conductor winding 112 or windings through the flux sensor core portion 102. In another embodiment, the transformer may have more than two windings. In such an embodiment or embodiments, all windings may pass through both elongated openings 106 and 110. If the transformer windings are of unequal turns, each winding will have a unique number of passes through each elongated opening 106 and 110. As used herein, a winding or windings may be a single wire wrapped or wound a single time or multiple times through the elongated openings 106 and 110.

The core flux sensor assembly 100 may also be used in an inductor type electromagnetic device. In an inductor configuration, only one electrical conductor winding will pass through both elongated openings 106 and 110. It should be noted that all magnetic core configurations described herein may be an inductor or transformer. The number and use of the windings determines whether the device is an inductor or transformer.

Figure 6A:
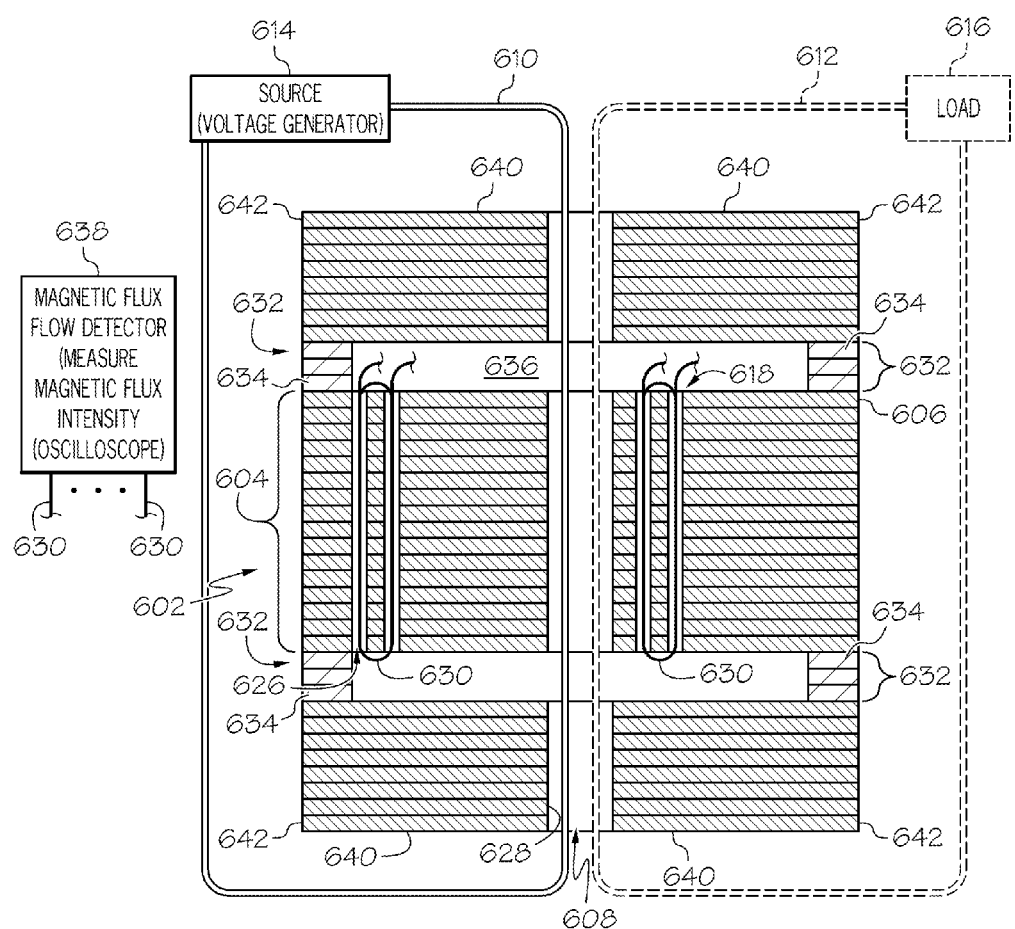
FIG. 6A is a cross-sectional view of an example of an inductor or transformer assembly depending upon the number of windings including a magnetic flux sensor in accordance with an embodiment of the present disclosure.
Figure 6B:
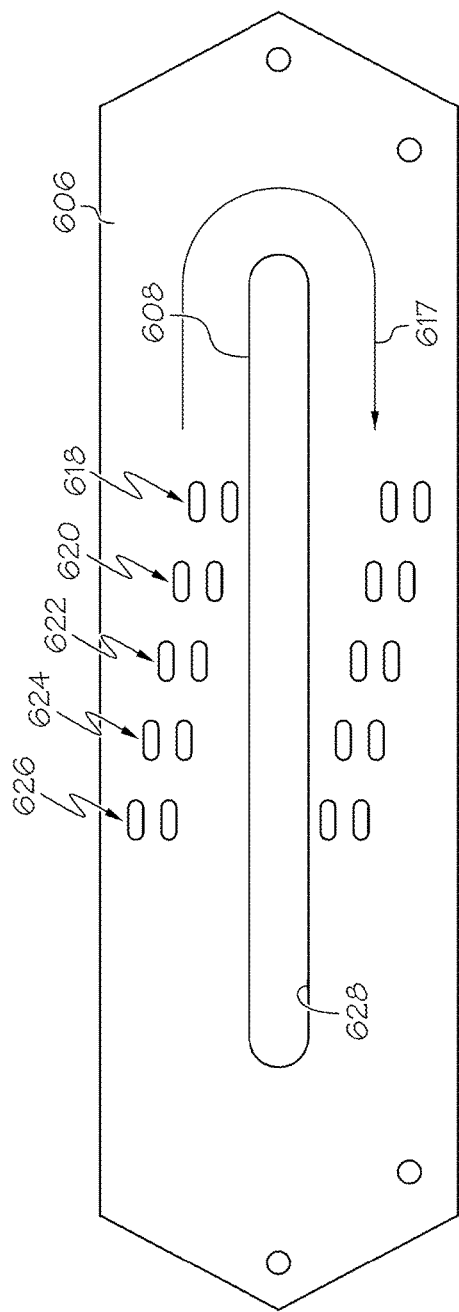
FIG. 6B is a top view of an example of a magnetic flux sensor plate or laminate in accordance with another embodiment of the present disclosure.

A magnetic core flux sensor assembly similar to the magnetic core flux sensor assembly 100 may also be configured with a single elongated opening such as that illustrated in FIGS. 6A and 6B. A magnetic core flux sensor assembly with a single elongated opening or at least one elongated opening may be used with an inductor type electromagnetic device which has only a single conductor winding, or in a transformer type configuration where both primary windings and at least one second windings which may be adjacent one another in the same elongated opening similar to that described in U.S. patent application Ser. No. 13/553,267.

An electrical current flowing through the conductor winding 108 or windings generates a magnetic field around the conductor or conductors 108 and a magnetic flux is absorbed by the core portion 102 and flows about the at least one elongated opening 106 in the core of the flux sensor core portion 102. In the transformer configuration, as illustrated in FIG. 1, a magnetic flux is absorbed in the core portion 102 and flows in the core of the flux sensor core portion 102 around the second elongated opening 110.

The magnetic core flux sensor assembly 100 also includes a plurality of pairs of flux sensor holes 114-122. The pairs of flux sensor holes 114-122 are placed in the flux sensor core portion 102 to support sensor conductors 128 or loop antenna sensors as described in more detail below. The loop antenna sensors are distributed in the flux sensor core portion 102 to detect the magnetic flux density in the core and the loop antenna sensors are distributed at predefined distances from the elongated winding opening 106 and in a distribution pattern that least affects the flow of magnetic flux in the core. Hence, the pairs of flux sensor holes 114-122 are positioned relative to the at least one elongated opening 106 for preventing significant disruption of the magnetic flux flow in the sensor core portion 102. The plurality of pairs of sensor holes 114-122 are also positioned for use in sensing the magnetic flux flow at different distances from an edge 124 of the at least one elongated opening 106. In the exemplary transformer configuration illustrated in FIGS. 1 and 2A, the plurality of sensor holes 114-122 are disposed along both longitudinal sides or longer dimensional sides of the elongated openings 106 and 110. However, in another embodiment, the plurality of pairs of sensor holes 114-122 may be disposed only along one longitudinal side 126 of the elongated opening 106. In some embodiments there may be only one elongated opening as in the magnetic flux sensor assembly illustrated in FIGS. 6A and 6B.

In the exemplary flux sensor plate 104 illustrated in FIGS. 2A and 2B, only five pairs of sensor holes 114-122 are shown; however, a magnetic flux sensor core portion may include any number of pairs of sensor holes depending upon the size of the electromagnetic device in which the flux sensor is to be used and the number of locations in the core where flux measurements may be desired. However, there may be constraints as to the size, number and placement of the sensor holes so as to minimize or avoid disruption of the magnetic flux flow in the flux sensor core portion.

Referring also to FIG. 2B, FIG. 2B is a partial view of the exemplary magnetic flux sensor plate 102 or laminate of FIG. 2A showing a detail of the sensor holes 114-122 in accordance with an embodiment of the present disclosure. The plurality of pairs of sensor holes 114-122 are each consecutively spaced along a longitudinal side 126 of the elongated opening 106 and with each consecutive pair of sensor holes 114-122 being positioned at an increasing distance from the edge 124 of the longitudinal side 126 of the elongated opening 106. The plurality of consecutive pairs of sensor holes 114-122 may be spaced uniformly at a predetermined distance "L" from one another along the longitudinal side 126 of the at least one elongated opening 106. The sensor holes 114-122 may be elongated holes and the predetermined distance "L" may be measured from a centerline of the long dimension of each elongated sensor hole 114-122 as illustrated in FIG. 2B. The first sensor hole 114a-122a of each pair of sensor holes 114-122 are closer to the longitudinal side 126 or edge 124 of the elongated opening 106 than a second sensor hole 114b-122b of each pair of sensor holes 114. The first and second sensor holes of each pair of sensor holes 114-122 may be the same distance apart with the first sensor hole being parallel to the second sensor hole and both holes being parallel to the longitudinal side 126 of the elongated opening 106. A centerline of the shorter dimension of a first sensor hole 114a of a first pair of sensor holes 114 may be at a selected a distance "D" from the edge 124 of the elongated opening 106. A distance of a centerline of the first sensor hole 114a-122a of each consecutive pair of sensor holes 116-122 may increase in distance from the edge 124 of the elongated opening 106 by about half the selected distance "D" or by "D/2". Accordingly, a centerline of the first sensor hole 116a of the second pair of sensor holes 116 may be a distance "D/2" from a centerline of the first sensor hole 114a of the first pair of sensor holes 114 and each successive first sensor hole 118a-122a will be about the distance D/2 from the first sensor hole of the adjacent pair of sensor holes and the distance D/2 farther from the edge 124 of the elongated opening 106.

Each of the sensor holes 114-122 may be an elongated opening similar to that illustrated in FIG. 2B for receiving a sensor conductor winding 128 or windings (FIG. 1). For example, each sensor hole may have a width of about D/2 and a length of about 1.5D.

A sensor conductor winding 128, windings or loop antenna sensors may be wound or passed through each pair of sensor holes 114-122. The magnetic flux flow generates an electrical signal in each sensor conductor 128. The electrical signal in a particular sensor conductor winding 128 corresponds to the magnetic flux flow at a location of the particular sensor conductor winding and pair of sensor holes 114-122. The sensor holes 114-122 and sensor windings 128 or loop antenna sensors are distributed in the core 104 to detect magnetic flux density at predefined distances from each elongated opening 106 and 110. The sensor holes 114-122 and sensor windings 128 are also placed in a distribution pattern that least affects the flow of magnetic flux as illustrated by arrows 127 and 129 in FIG. 2A. The magnetic flux flow in the cores 104a and 104b will be in opposite directions as illustrated by arrows 127 and 129 about the respective elongated openings 106 and 110 because of the direction of electric current flow in the windings 108 (FIG. 1) through the elongated openings 106 and 110 and the right-hand rule. Based on the right-hand rule, electric current flowing into the page in windings through elongated opening 106 will cause a magnetic flux flow in the direction of arrow 129 in the example in FIG. 2A, and electric current flowing out of the page in the same windings through elongated opening 110 will cause a magnetic flux flow in the direction of arrow 127.

In accordance with another embodiment, rather than a plurality of pairs of sensor holes 114-122, there may be a plurality of single sensor holes. Each sensor hole may be positioned relative to the at least one elongated opening 106 and 110 for preventing significant disruption of the magnetic flux flow in the sensor core portion 104 and for use in sensing the magnetic flux flow at different distances from an edge 124 of the at least one elongated opening 106 and 110. The sensor conductor winding 128 may be a single wire or antenna element in each single sensor hole. The single sensor holes may be substantially circular or round or may be shaped to accommodate a size and shape of the single wire or antenna element.

As previously discussed, the flux sensor core portion 102 may include a plurality of flux sensor core plates 104 (FIG. 2A) stacked on one another (FIG. 1). The at least one elongated opening 106 and the plurality of pairs of sensor holes 114-122 are formed in each flux sensor core plate 104. As shown in FIG. 2A, each flux sensor core plate 104 may include a first plate portion 104a and a second plate portion 104b. The first elongated opening 106 may be formed in the first plate portion 104A and the second elongated opening 110 may be formed in the second plate portion 104b. A plurality of pairs of sensor holes 114-122 may be formed on both sides of the elongated openings 106 and 110 as shown in the embodiment of FIG. 2A.

The first plate portion 104a may include an extension member 130 extending from one end of the first plate portion 104a and the second plate portion 104b may include another extension member 132 extending from an end of the second plate portion 104b opposite the extension member 130 of the first plate portion 104a. A hole 134 may be formed and each of the extension members 130 and 132 for receipt of a holding device, such as a fastener, for holding the flux sensor core plates 104 together in the stack with the elongated openings 106 and 110 and the plurality of sensor holes 114-122 of each of the sensor core plates 104 in the stack in alignment with one another. Other holes 135 may also be formed in the flux sensor core plates 104 for receipt of additional holding devices or fasteners.

Figure 3:
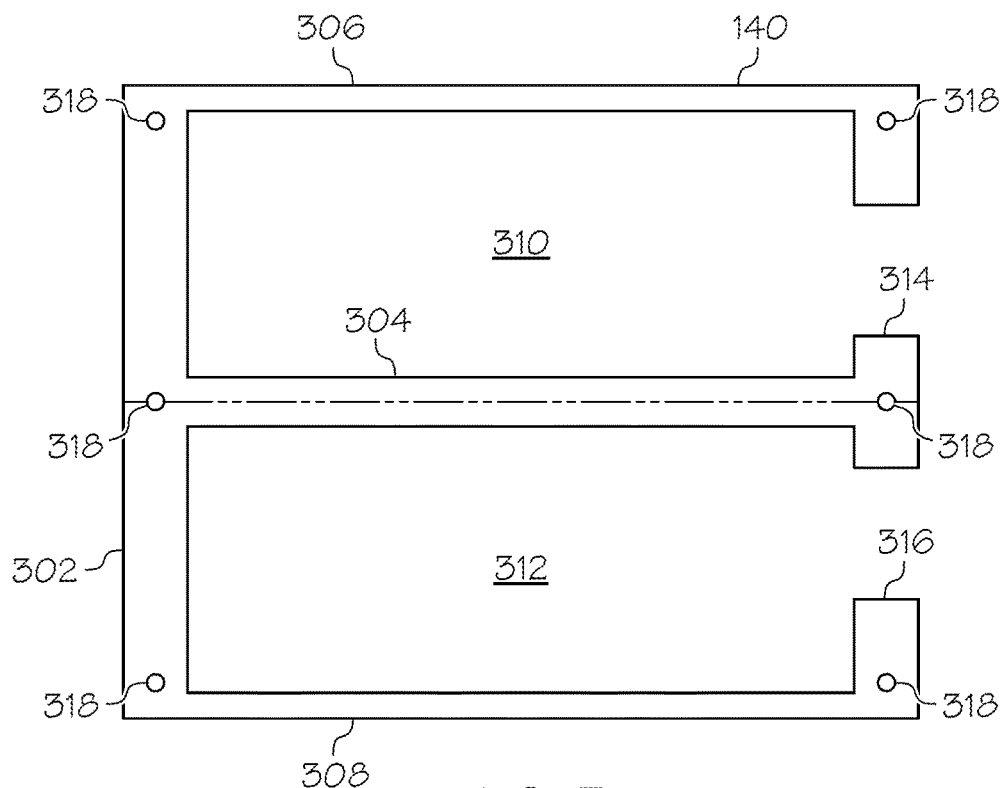
FIG. 3 is a top view of an example of a spacer plate or laminate in accordance with an embodiment of the present disclosure.

The magnetic core flux sensor assembly 100 may also include a spacer portion 136 and 138 disposed on each outside flux sensor core plate 104. Each spacer portion 136 and 138 may include a plurality of spacer plates 140 stacked on one another. The spacer plates 140 may be made from a non-magnetic material or material that is an electrical insulator or dielectric. Referring also to FIG. 3, FIG. 3 is a top view of an example of a spacer plate 140 or laminate in accordance with an embodiment of the present disclosure. The spacer plate 140 may be substantially "E" shaped as illustrated in FIG. 3. The spacer plate 140 may include a main segment 302, a center segment 304 extending from a central portion of the main member 302 and two outer segments 306 and 308 extending from opposite ends of the main segment 302. A plurality of spacer plates 140 stacked to form the spacer portions 136 and 138 provide openings 310 and 312 formed between the two outer segments 306 and 308 and the center segment 304 as in the embodiment illustrated in FIG. 3. The primary conductor windings 108 and secondary conductor windings 112 pass or extend through the openings 310 and 312 as illustrated by the broken lines and FIG. 1. In accordance with another embodiment, such as the exemplary inductor configuration illustrated in FIG. 6A, the spacer plate 140 may only have a single opening through which a conductor winding passes or extends as illustrated in FIG. 6A.

Each spacer plate 140 may also include a gap or gaps 314 and 316 for the sensor conductor windings 128 that pass through each pair of sensor holes 114-122 (FIG. 2A) to connect to a device (shown in FIG. 4) for detecting the magnetic flux flow at the location of each sensor conductor winding 128 and associated pair of sensor holes 114-122. Each spacer plate 140 may also include holes 318 which will align with holes 134 and 135 in the flux sensor core plates 130 to receive holding devices or fasteners for holding the components of the magnetic core flux sensor assembly 100 together.

FIG. 4A is a perspective view of an example of a transformer assembly 400 with a portion of the upper magnetic core portion 402 cut-away to show an exemplary core flux portion sensor assembly in accordance with an embodiment of the present disclosure. The exemplary core flux portion sensor assembly shown in FIG. 4A is the same as the magnetic core flux sensor assembly 100 of FIG. 1 although other configurations may also be used. FIG. 4B is a side cross-sectional view taken along lines 4A-4A of the exemplary transformer assembly 400 of FIG. 4A. The transformer assembly 400 includes a magnetic core portion 402 and 404 respectively disposed on each spacer portion 136 and 138. The elongated openings 106 and 110 extend through each magnetic core portion 402 and 404 and the primary and secondary conductor windings 108 and 112 extend or pass through each magnetic core portion 402 and 404. The primary conductor windings 108 may connect to a source 406 of electrical power and the secondary conductor windings 112 may connect to a load 408 which may be a variable load. The electrical source 406 may be a voltage generator or other device for conducting an electrical current through the conductor windings 108 to generate a magnetic field about the primary conductor windings 108 and a magnetic flux flow about the elongated openings 106 and 110 extending through the magnetic flux sensor assembly 100 and the core portions 402 and 404. As previously discussed, the assembly 400 may include more than two windings 108 and 112 and may also be configured as an inductor if only one winding passes through both elongated openings 106 and 110.

Similar to that previously discussed, at least the spacer portion 136 may include a gap 409 formed by gaps 314 and 316 in spacer plates 140 for the sensor conductor windings 128 to connect to a magnetic flux flow test assembly 410. The magnetic flux flow test assembly 410 may include a device for detecting and/or measuring the magnetic flux flow at the location of each sensor conductor winding 128 for sensor holes 114-122. The magnetic flux flow test assembly 410 or device may include or may be an oscilloscope for displaying the electrical signal in each particular sensor conductor winding 128 which corresponds to the magnetic flux flow at a location of the particular sensor conductor winding 128 in the sensor holes 114-122.

Figure 5:
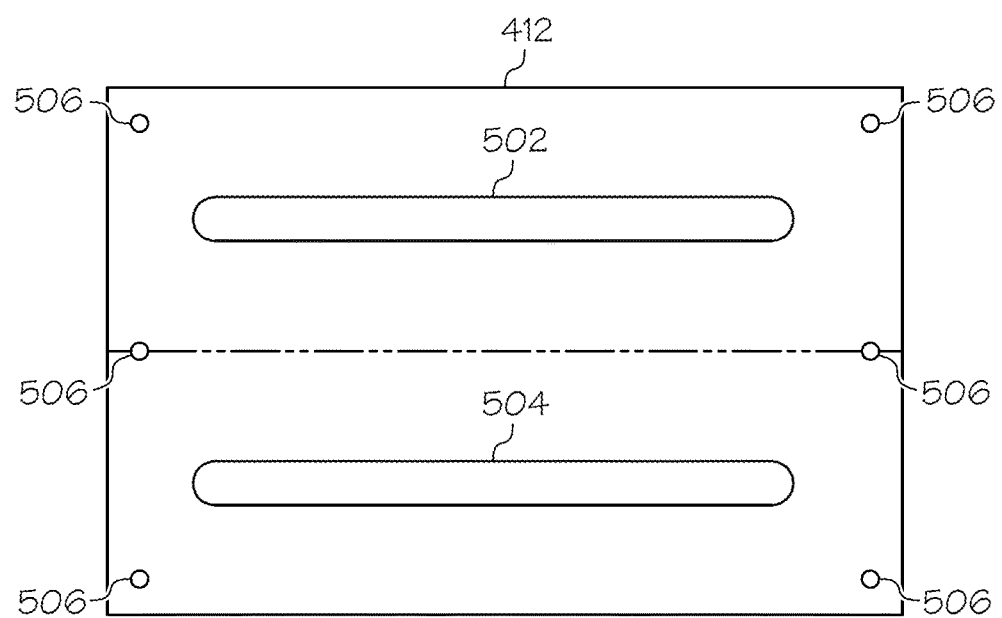
FIG. 5 is a top view of an example of a magnetic core plate or laminate in accordance with an embodiment of the present disclosure.

Each magnetic core portion 402 and 404 may include a plurality of magnetic core plates 412 or laminates stacked on one another as illustrated in the exemplary embodiment in FIG. 4B. The plates 412 may be made from the same material as the sensor plates 104 that is capable of absorbing a magnetic flux as described herein. Referring also to FIG. 5, FIG. 5 is a top view of an example of a magnetic core plate 412 or laminate in accordance with an embodiment of the present disclosure. The exemplary magnetic core plate 412 illustrated in FIG. 5 may be used in a transformer type configuration or assembly, such as the exemplary transformer assembly 400 illustrated in FIG. 4. The magnetic core plate 412 includes a first elongated opening 502 and a second elongated opening 504. The second elongated opening 504 may be parallel to the first elongated opening 502 to permit the conductor winding or windings 108 and 122 to pass through the stacked magnetic core plates 412 forming the magnetic core portions 402 and 404.

Each magnetic core plate 412 may also include a plurality of holes 506 which align with the openings 310 in the spacer plates 140 and openings 134 and 135 in the flux sensor core plates 104 assembling the transformer 400.

Figure 6C:
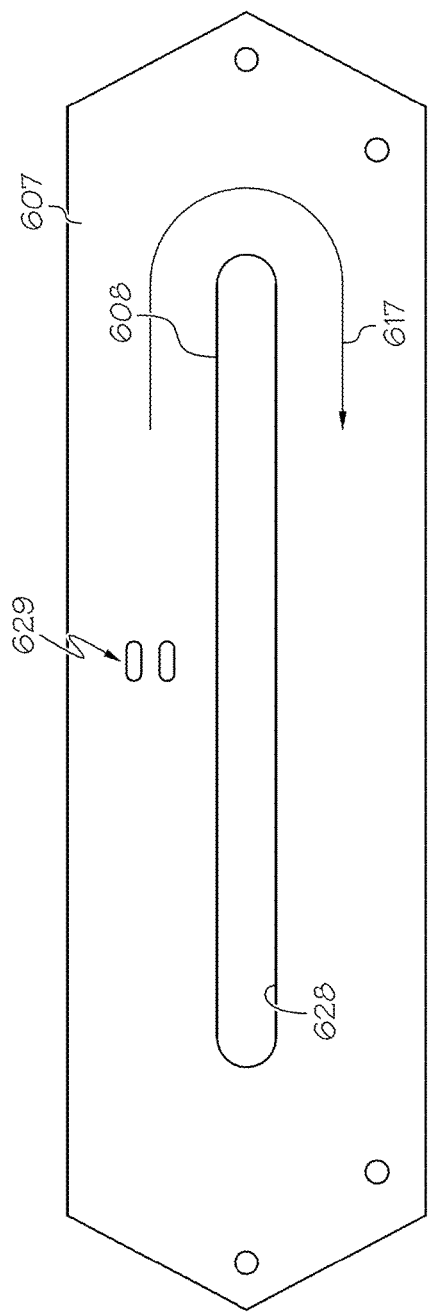
FIG. 6C is a top view of an example of a magnetic flux sensor plate or laminate including a single pair of sensor holes in accordance with another embodiment of the present disclosure.

FIG. 6A is a cross-sectional view of an example of an electromagnetic device 600 including a magnetic flux sensor assembly 602 in accordance with an embodiment of the present disclosure. The exemplary electromagnetic device 600 may be an inductor assembly if there is only a single conductor winding, or a transformer assembly if primary and secondary conductor windings are provided. A secondary conductor 612 and load 616 are shown in phantom or dashed lines in FIG. 6A to illustrate an example of a transformer configuration. The magnetic core flux sensor assembly 602 may be similar to the magnetic core flux sensor assembly 100 described with reference to FIG. 1; however, the electromagnetic device 600 may include a single opening for conductor windings. Accordingly, the electromagnetic device 600 may include a flux sensor core portion 604. Similar to that previously described, the flux sensor core portion 604 may include a plurality of flux sensor plates 606 or laminates stacked on one another as shown in FIG. 6A. Referring also to FIG. 6B, FIG. 6B is a top view of an example of a flux sensor plate 606 or laminate for use with the magnetic core flux sensor assembly 602 in accordance with an embodiment of the present disclosure. The electromagnetic device 600 may include at least one elongated opening 608 through the flux sensor core portion 604 and through other components of the electromagnetic device 600 for receiving a conductor winding 610 or windings. As previously described, the electromagnetic device 600 may be an inductor assembly with only a single conductor winding 610 or windings, or may include at least one secondary winding 612 in a transformer configuration in which configuration the winding 610 may be a primary winding. Both primary and secondary windings 610 and 612 may pass through the same elongated opening 608 but may be spatially separated or insulated from one another similar to that described in U.S. patent application Ser. No. 13/553, 267. The windings 610 may be connected to an electrical source 614. The electrical source may be a voltage generator or other source of electrical power. If the electromagnetic device 600 is a transformer and includes secondary windings 612, the secondary windings 612 may be connected to a load 616. The electrical current flowing through the conductor winding 610 or windings generates a magnetic field about the conductor winding 610 and the magnetic field generates a magnetic flux flow (illustrated by arrow 617 in FIG. 2B 6B) about the at least one elongated opening 608 in the flux sensor core portion 604 and other core portions of the electromagnetic device 600. In accordance with another embodiment, the flux sensor plate 606 may include only a single sensor hole or single pair of sensor holes 629 as shown in the exemplary flux sensor plate 607 in FIG. 6C. The sensor hole or holes 629 may be positioned a selected distance from the elongated opening 608 to sense the magnetic flux at that location from the elongated opening 608. A sensor conductor winding or windings may pass through the sensor holes 629 similar to that described herein.

Each flux sensor plate 606 of the flux sensor core portion 602 may also include a plurality of pairs of sensor holes 618-626 positioned relative to the at least one elongated opening 608. The plurality of pairs of sensor holes 618-626 are positioned for preventing significant disruption of the magnetic flux flow in the sensor core portion 602 and for use in sensing the magnetic flux flow at different distances from an edge 628 of the at least one elongated opening 608. The plurality of pairs of sensor holes 618-626 may be positioned similar to the sensor holes 114-122 described with reference to FIGS. 2A and 2B. The plurality of pairs of sensor holes 618-626 may be disposed on both longitudinal sides of the elongated opening 608 as shown in FIG. 6B, or in another embodiment, the plurality of pairs of sensor holes 618-626 may be disposed only on one longitudinal side of the elongated opening 608. Accordingly, the sensor holes are positioned to support sensor conductor windings 630 or loop antenna sensors distributed in the sensor core portion 602 to detect magnetic flux density at predefined distances from the elongated opening 608. The distribution pattern of the sensor holes 618-626 and loop antenna sensors is to least affect the flow of magnetic flux in the laminate or core 602.

A sensor conductor winding 630 or loop antenna sensors may pass or extend through each pair of sensor holes 618-626. The magnetic flux flow in the flux sensor core 604 generates an electrical signal in each sensor conductor winding 630. The electrical signal in a particular sensor conductor winding 630 corresponds to the magnetic flux flow at a location of the particular sensor conductor winding 630 or associated sensor holes 618-626.

A spacer portion 632 may be disposed on opposite sides of the flux sensor core 604. Each spacer portion 632 may include a plurality of spacer plates 634 or laminates similar to the spacer plate 140 described with reference to FIG. 3 except the spacer plate 634 may be substantially C-shaped and may include only a single opening 636 similar to the opening 310 or 312 in FIG. 3. The conductor winding 610 passes through the opening 636 in the spacer portion 632 similar that illustrated in FIG. 6A. Each spacer plate 634 may also include a gap similar to the gap 314 or 316 in the spacer plate 140 (FIG. 3) that provide a gap 636 or opening for the sensor windings 630 through each pair of sensor holes 618-626 to connect to a magnetic flux flow detector 638. The magnetic flux flow detector 638 may measure the magnetic flux intensity at each of the locations of the sensor conductor windings 630 through sensor holes 618-626. Similar to that previously described, the magnetic flux flow and the detector 638 may be an oscilloscope for displaying a waveform of the electrical signal on each sensor conductor winding 630 which corresponds to the magnetic flux flow at the location of each particular sensor conductor winding passing through the sensor holes 618-626.

The electromagnetic device 600 may also include a magnetic core portion 640 disposed on each spacer portion 632. The at least one elongated opening 628 extends through the magnetic core portion 640 and the conductor winding 610 extends through each magnetic core portion 640. The magnetic core portion 640 may be made from a stack of magnetic core plates 642 similar to that previously described. Each magnetic core plate 642 or laminate may be similar to the magnetic core plate 412 in FIG. 5 except with a single elongated opening, such as opening 502, for receipt of the conductor windings 610.

In accordance with another embodiment of the present disclosure, the electromagnetic device 600 may be formed using plates of laminates to form the flux sensor core portion 604 and magnetic core portions 640 that each include a constant width from the elongated opening 628 to a perimeter edge of each core portion 604 and 640 or perimeter edge of each plate forming the respective core portion 604 and 640. The constant width provides a consistent core cross-sectional area in the respective core portions 604 and 640 for a magnetic circuit in the core portions 604 and 640 for magnetic flux to flow about the elongated opening 628 as previously described. Examples of plates or laminates that may be stacked to form the flux sensor core portion 604 and magnetic core portions 640 including a predetermined width "W" from a perimeter edge of each plate or core portion 604 and 640 to the elongated opening 628 that is constant about a perimeter of each plate or core portion 604 and 640 will be described with reference to FIGS. 7-11.

Figure 7:
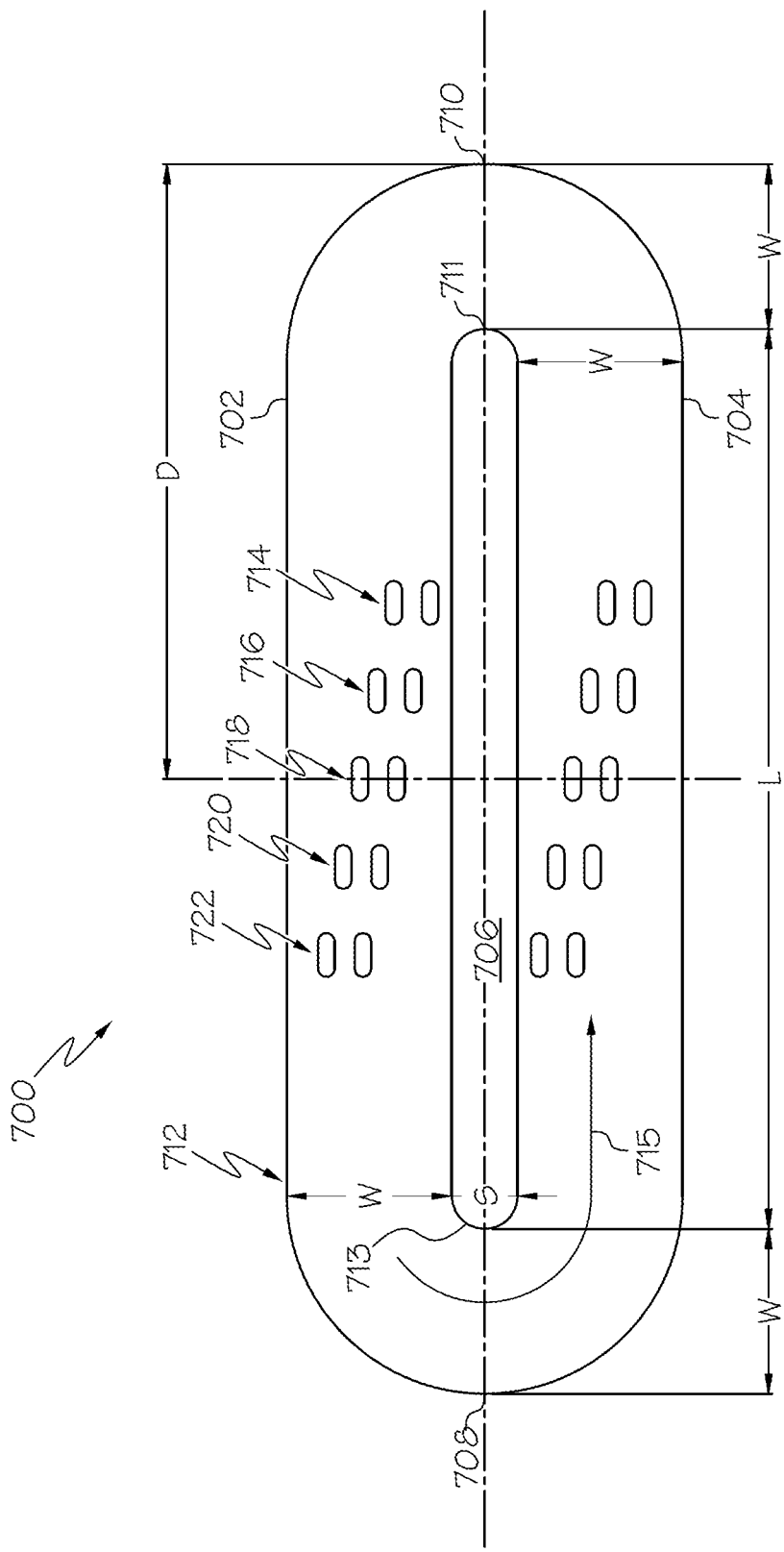
FIG. 7 is a top view of an example of a magnetic flux sensor plate or laminate in accordance with an embodiment of the present disclosure.

Referring also to FIG. 7, FIG. 7 is a top view of an example of a flux sensor core plate 700 or laminate in accordance with an embodiment of the present disclosure. The flux sensor core plate 700 may be used for the flux sensor core plate 606 to form the flux sensor core portion 604 of the electromagnetic device 600 in FIG. 6A. The flux sensor core plate 700 may include two opposite linear sides 702 and 704 that may each be parallel to longitudinal sides of an elongated opening 706 between the two opposite sides 702 and 704. The elongated opening 706 may form the elongated opening 628 in FIG. 6A when one or more flux sensor core plates 700 are stacked on one another to form the flux sensor core portion 604. The elongated opening 706 may have a selected length "L" and selected width "S" configured to receive a conductor winding or windings as described herein. The elongated opening 706 may have rounded or semicircular ends 711 and 713 with a chosen radius of curvature. The two opposite linear sides 702 and 704 may each have a length that corresponds to the selected "L" of the elongated opening 706. The flux sensor core plate 700 may also include substantially semicircular ends 708 and 710 that join the opposite sides 702 and 704. The flux sensor core plate 700 may include a predetermined width "W" from a perimeter edge 712 of the flux sensor core plate 700 to the elongated opening 706 that is constant about the perimeter of the flux sensor core plate 700. Accordingly, when one or more flux sensor core plates 700 are stacked on one another to form a flux sensor core portion, such as flux sensor core portion 604 in FIG. 6A, the flux sensor core portion 604 includes the predetermined width "W" from a perimeter edge of the flux sensor core portion 604 to the elongated opening 628 that is constant about the perimeter of the flux sensor core portion 604. The constant width of the flux sensor core portion 604 provides a consistent core cross-sectional area for a magnetic circuit about the elongated opening 706 or 628 (FIG. 6A) for magnetic flux flow represented by arrow 715 in FIG. 7. The direction of the arrow 715 will be dependent upon the direction of the current flowing in a conductor winding through the elongated opening 706 and the right hand rule similar that previously described.

A plurality of pairs of sensor holes 714-722 may be positioned relative to the elongated opening 706. The plurality of sensor holes 714-722 may be configured for preventing significant disruption of the magnetic flux flow 715 in the flux sensor core portion 604 and for use in sensing the magnetic flux flow 715 at different distances from the elongated opening 706. The plurality of pairs of sensor holes 714-722 may be configured and positioned similar to the pairs of sensor holes 114-122 described with reference to FIGS. 2A and 2B. The plurality of pairs of sensor holes 714-722 may be centered about a centerline of a longitudinal dimension of the flux sensor core plate 700 or at a distance "D" from an end of the flux sensor core plate 700 which may correspond to the centerline of the plate 700. The flux sensor core plate 700 may be made from the same material as the sensor plate 104 in FIGS. 1 and 2A that is capable of absorbing a magnetic flux as described herein. In accordance with another embodiment, the sensor holes 714-722 may be on only one side of the elongated opening 706 or on both sides as in the exemplary flux sensor core plate 700 shown in FIG. 7. In accordance with a further embodiment, only a single sensor hole or single pair of sensor holes may be positioned on one side of the elongated opening 706 similar to that described with reference to FIG. 6C.

Figure 8:
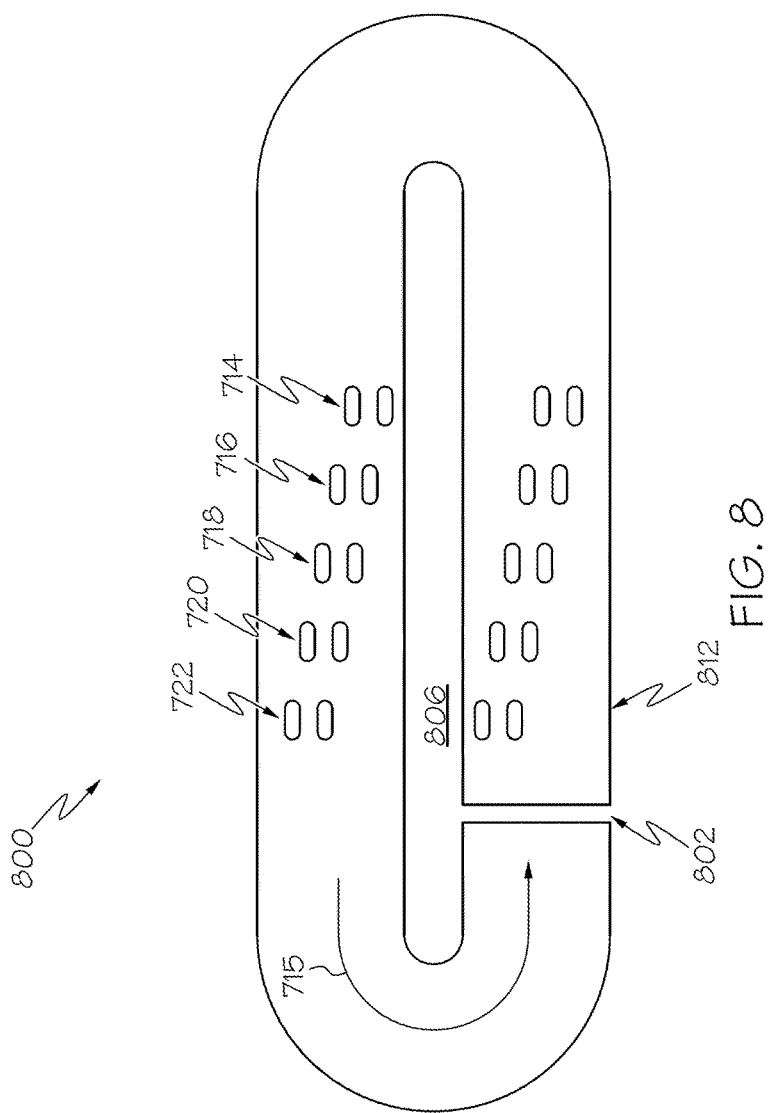
FIG. 8 is a top view of an example of a magnetic flux sensor plate or laminate including a gap in the magnetic flux path in accordance with an embodiment of the present disclosure.

In accordance with an embodiment, the flux sensor core plate 700 may include a gap formed in the magnetic circuit defined about the elongated opening 706. FIG. 8 is an example of a flux sensor core plate 800 similar to the flux sensor core plate 700 but including a gap 802 extending from an elongated opening 806 to a perimeter edge 812 of the flux sensor core plate 800. Otherwise, the flux sensor core plate 800 may be substantially similar to the flux sensor core plate 700. One or more of the flux sensor core plates 800 may be stacked to form the flux sensor core portion 604 in FIG. 6A. The gap 802 will cause a disruption of the magnetic flux flow 715 in the magnetic core circuit defined about the elongated opening 806.

Figure 9:
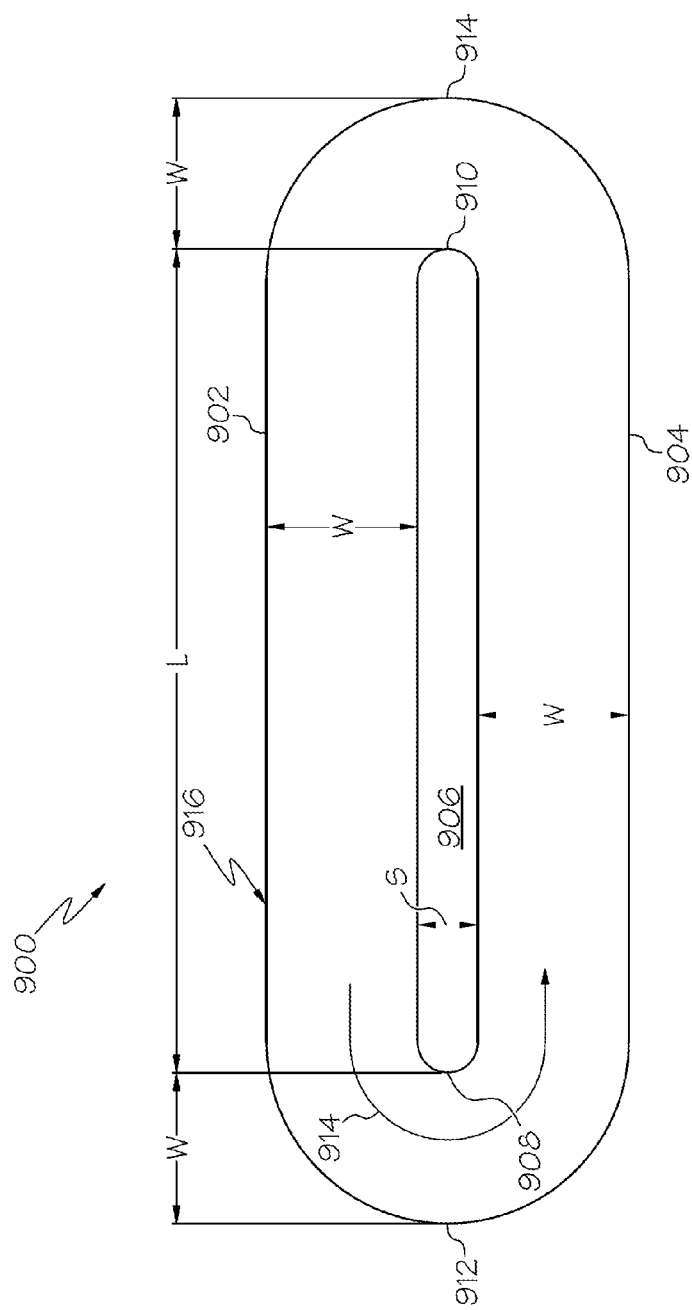
FIG. 9 is a top view of an example of a magnetic core plate or laminate in accordance with an embodiment of the present disclosure.

FIG. 9 is a top view of an example of a magnetic core plate 900 or laminate in accordance with an embodiment of the present disclosure. The magnetic core plate 900 may be used for the magnetic core plates 642 to form the magnetic core portions 640 in FIG. 6A. The magnetic core plate 900 may include two opposite linear sides 902 and 904 that may each be parallel to longitudinal sides of an elongated opening 906 between the two opposite sides 902 and 904. The elongated opening 906 may form the elongated opening 628 in FIG. 6A when one or more magnetic core plates 900 are stacked on one another to form each of the magnetic core portions 640. The elongated opening 906 may have a selected length "L" and selected width "S" configured to receive a conductor winding or windings as described herein. The elongated opening 906 may have rounded or semicircular ends 908 and 910 with a chosen radius of curvature. The two opposite linear sides 902 and 904 may each have a length that corresponds to the selected length "L" of the elongated opening 906. The magnetic core plate 900 may also include substantially semicircular ends 912 and 914 that join the opposite sides 902 and 904. The flux sensor core plate 900 may include a predetermined width "W" from a perimeter edge 916 of the flux sensor core plate 900 to the elongated opening 906 that is constant about the perimeter of the flux sensor core plate 900. Accordingly, when one or more magnetic core plates 900 are stacked on one another to form a magnetic core portion, such as magnetic core portions 640 in FIG. 6A, the magnetic core portion 640 includes the predetermined width "W" from a perimeter edge of the magnetic core portion 640 to the elongated opening 906 or 628 in FIG. 6A that is constant about the perimeter of the magnetic core portion 604. The magnetic core plate 900 may be made from the same material as the plate 104 in FIG. 1.

Figure 10:
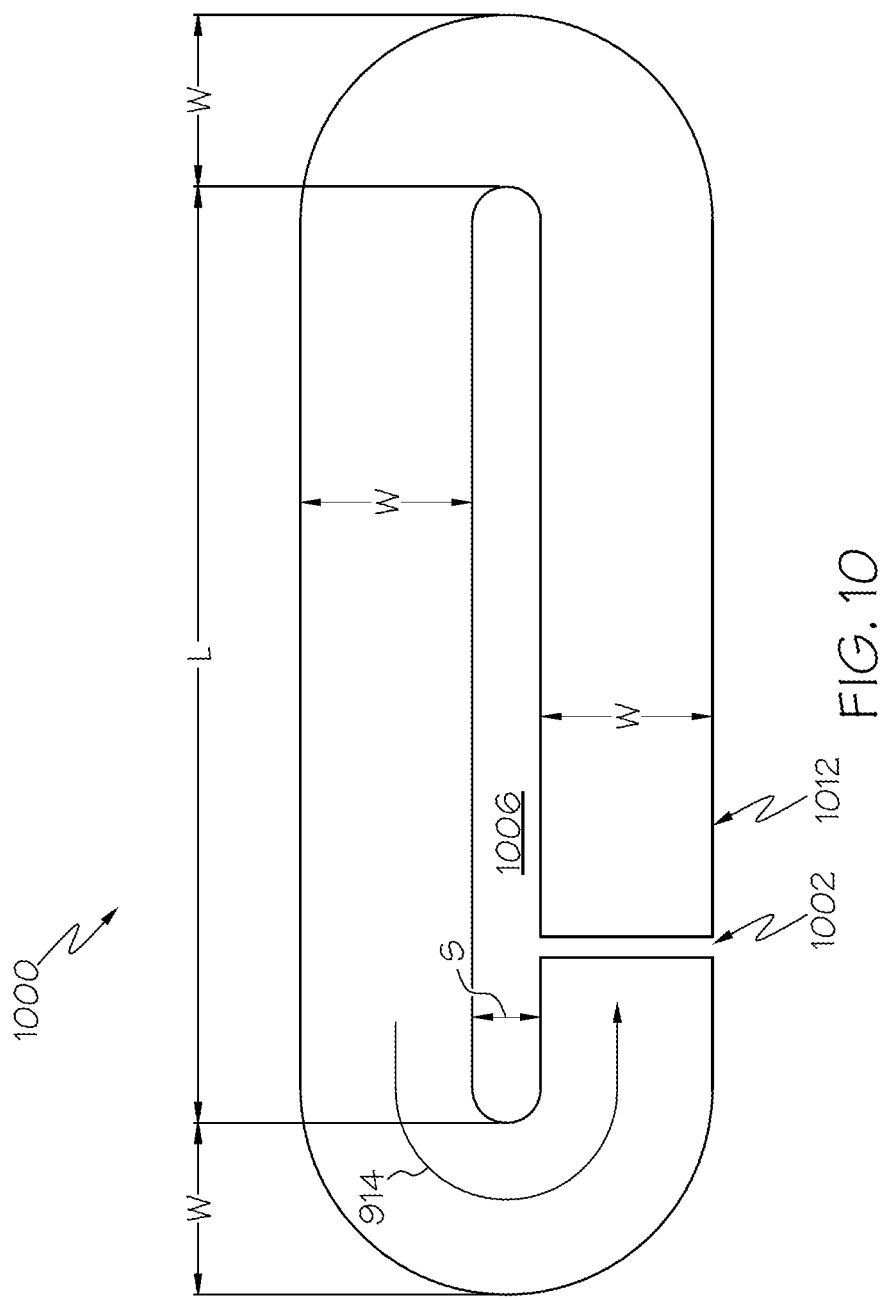
FIG. 10 is a top view of an example of a magnetic core plate or laminate including a gap in the magnetic flux path in accordance with an embodiment of the present disclosure.

In accordance with an embodiment, the magnetic core plate 900 may include a gap formed in the magnetic circuit 914. FIG. 10 is an example of a magnetic core plate 1000 similar to the magnetic core plate 900 but including a gap 1002 formed from an elongated opening 1006 to a perimeter edge 1012 of the flux sensor core plate 1000. Otherwise, the magnetic core plate 1000 may be substantially similar to the magnetic core plate 900. One or more of the magnetic core plates 1000 may be stacked to form the flux sensor core portion 604 in FIG. 6A. The gap 1002 will provide a disruption of the magnetic flux flow in the magnetic circuit 914 of the magnetic core plate 1000.

Figure 11:
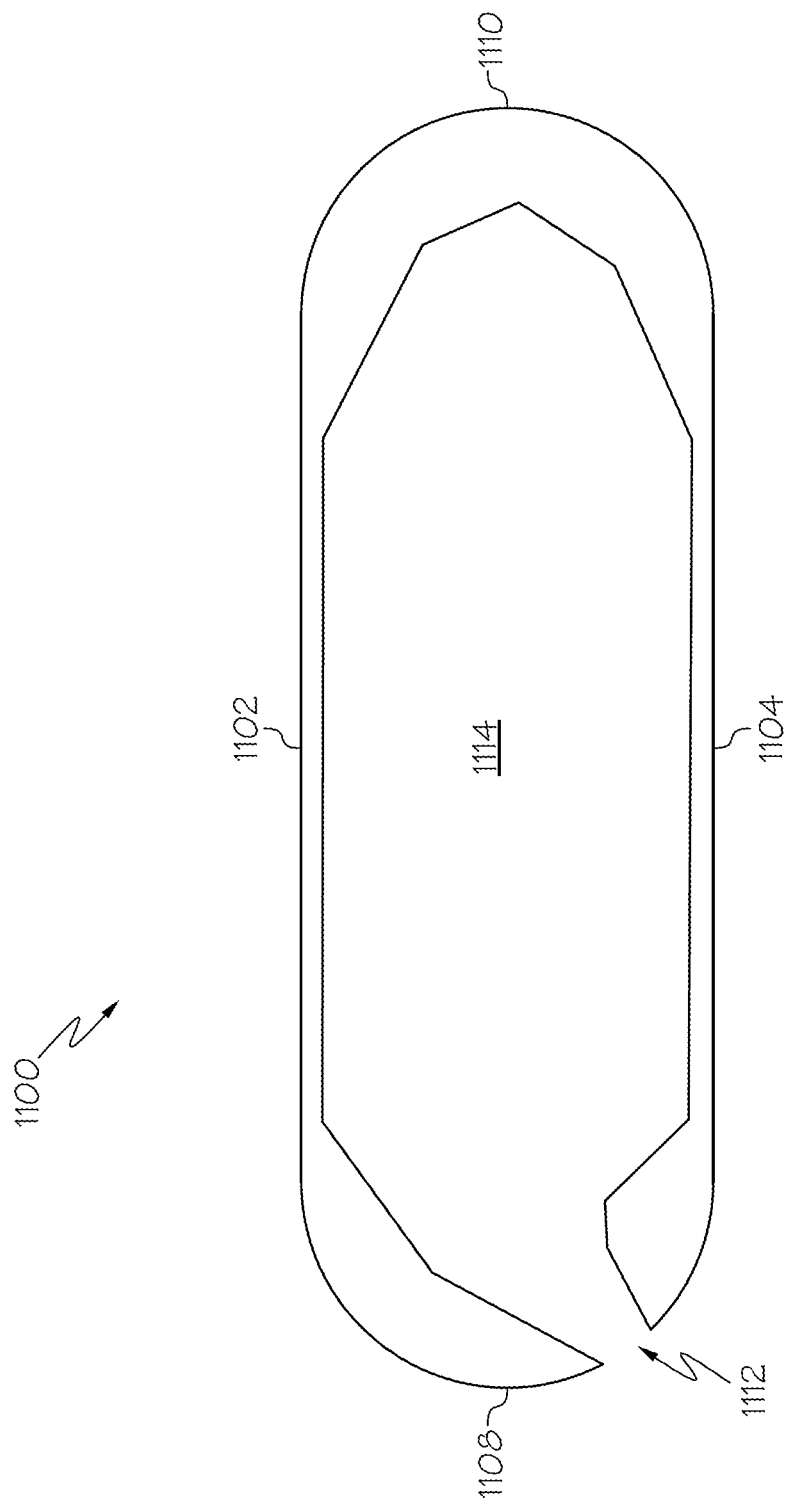
FIG. 11 is a top view of an example of a spacer plate or laminate in accordance with an embodiment of the present disclosure.

FIG. 11 is a top view of an example of a spacer plate 1100 or laminate in accordance with an embodiment of the present disclosure. The space plate 1100 may have a shape corresponding to the flux sensor core plate 700 and magnetic core plate 900 so one or more spacer plate 1100 may be stacked to form a space portion, such as spacer portion 632 in FIG. 6A between flux sensor core portion 604 and the magnetic core portions 640. Accordingly, the spacer plate 1100 may include opposite parallel sides 1102 and 1104 that are joined by substantially semicircular ends 1108 and 1110. At least one end of the spacer plate 1100 may include a gap 1112 through which sensor conductor windings 630 may pass to connect to a device for detecting and measuring the magnetic flux flow and magnetic flux flow intensity in the flux sensor core portion 604, such as device 638 in FIG. 6A. An interior 1114 of the spacer plate 1100 is substantially open to accommodate the multiple sensor conductor windings 630. The interior 1114 of the space plate 1100 may define the gap or opening 636 in FIG. 6A when one or more spacer plates 1100 are stacked on one another to form the spacer portions 632 in FIG. 6A.

Figure 12B:
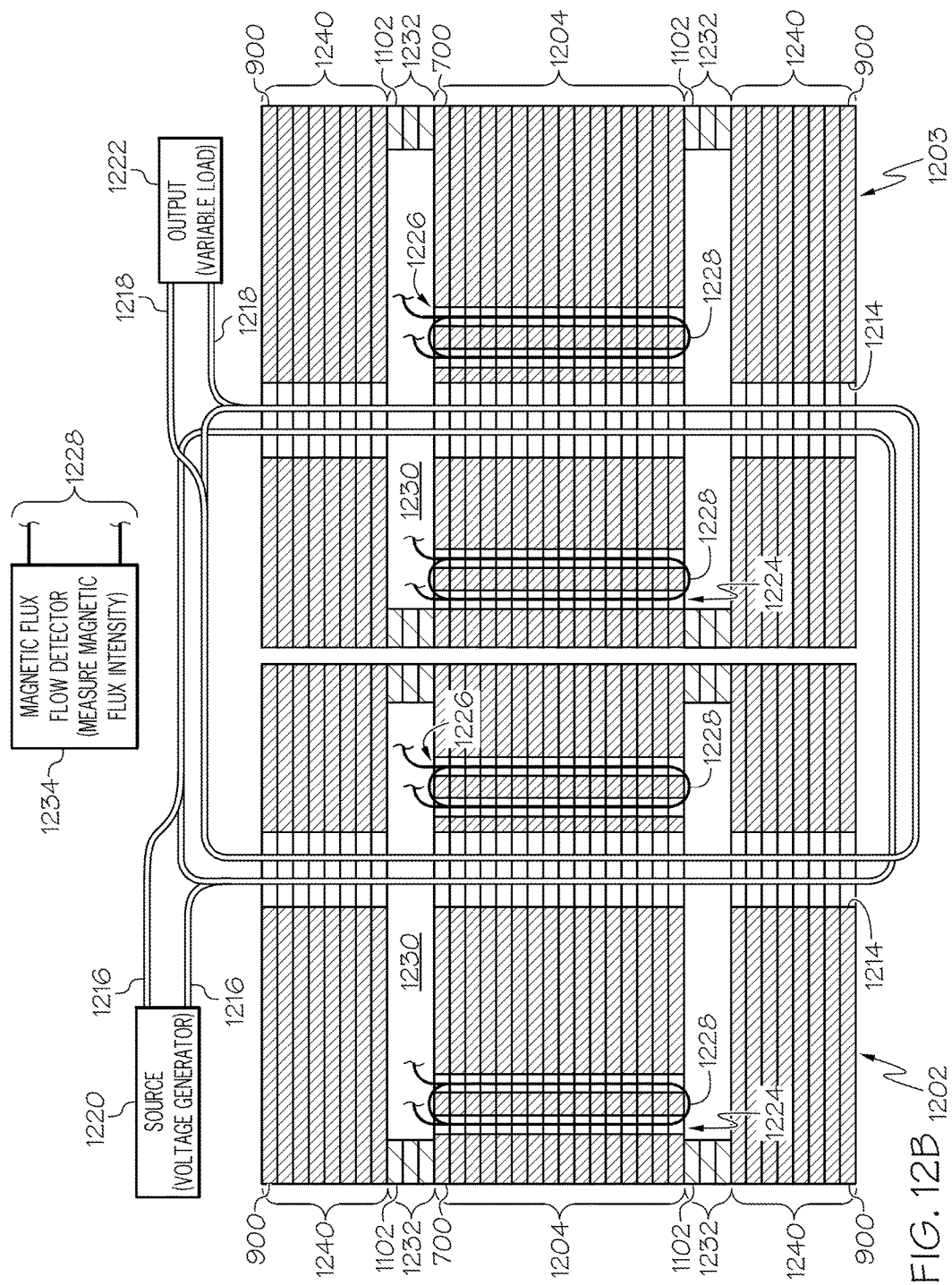
FIG. 12B is a cross-section view of the exemplary electromagnetic device of FIG. 12A taken along lines 12A-12A.

FIG. 12A is a top view of an example of an electromagnetic device 1200 in accordance with an embodiment of the present disclosure. The electromagnetic device 1200 may include a first magnetic core assembly 1202 and a second magnetic core assembly 1203. FIG. 12B is a cross-sectional view of the exemplary electromagnetic device 1200 of FIG. 12A taken along lines 12B-12B. Each of the magnetic core assemblies 1202 and 1203 may be similar to the electromagnetic device 600 in FIG. 6A formed by stacking one or more flux sensor core plates 700 or 800 to form a flux sensor core portion 1204 (FIG. 12B) similar to flux sensor core portion 604 in FIG. 6A; stacking one or more spacer portions 1102 on each side of the flux sensor core portions 1204 to form a spacer portions 1232 similar to spacer portion 632 in FIG. 6A; and stacking one or more magnetic core plates 900 or 1000 to form the magnetic core portions 1240 similar to magnetic core portions 640 in FIG. 6A.

The first magnetic core assembly 1202 and the second magnetic core assembly 1203 may be formed by stacking the different plates 700 or 800, 900 or 1000, and 1102 in a fixture or support arrangement 1206. Support arrangement 1206 is an example of how the magnetic core assemblies 1202 and 1203 may be stacked. Any suitable arrangement for stacking the plates may be used however and the present invention is not intended to be limited by the particular support arrangement described herein. The support arrangement 1206 may include a plurality of posts 1208 positioned at predetermined locations on a base member 1210 to retain the stacked plates 700, 900 and 1102. A mating support member (not shown) may be placed over the support arrangement 1206 to hold the stacked plates 700, 900 and 1102 in place. The mating support member may include a plurality of posts 1212 shown in phantom in FIG. 12A which are offset from posts 1208 so that different numbers of plates 700, 900 and 1102 may be stacked to form the first and second magnetic core assemblies 1202 and 1203 without the posts 1208 and 1212 interfering with one another.

When the plates 700 or 800, 900 or 1000 and 1100 are stacked to form the first magnetic core assembly 1202 and the second magnetic core assembly 1203, the elongated openings 706 and 906 in each of the plates 700 and 900 are aligned to from the elongated openings 1214 in each of the magnetic core assemblies 1202 and 1203. A primary conductor winding 1216 and a secondary conductor winding 1218 may be received in the elongated opening 1214 in each magnetic core assembly 1202 and 1203. The primary conductor winding 1216 may be coupled to a source 1220. The source 1220 may be a voltage generator or other source for passing a current through the primary conductor winding 1216. The primary conductor winding may be a single wire conductor that is passed a predetermined number of times through the elongated opening 1214 in each magnetic core assembly 1202 and 1203.

The secondary winding 1218 may be coupled to an output 1222 or load which may be a variable load. The secondary winding 1218 may also be a single wire conductor that is passed a selected number of times through the elongated opening 1214 in each magnetic core assembly 1202 and 1203.

Additionally, the sensor holes 714-722 in the flux sensor core plates 700 or 800 will be aligned to form the sensor holes 1224 and 1226 in the magnetic flux sensor core portion 1204 of each of the magnetic core assemblies 1202 and 1203. A sensor conductor winding 1228 may pass through each of the sensor holes 1224 and 1226 for detecting the magnetic flux flow in the flux sensor core portion 1204 of each magnetic core assembly 1202 and 1203. The sensor conductor windings 1228 may pass through a space 1230 formed by the spacer portion 1232 and may pass through the gap 1112 shown in FIG. 11 to connect to a magnetic flux flow detector 1234. The magnetic flow detector 1234 may detect and measure an intensity or magnitude of the magnetic flux flow at each of the locations of the sensor conductor windings 1228 similar to that previously described.

Figure 13A:
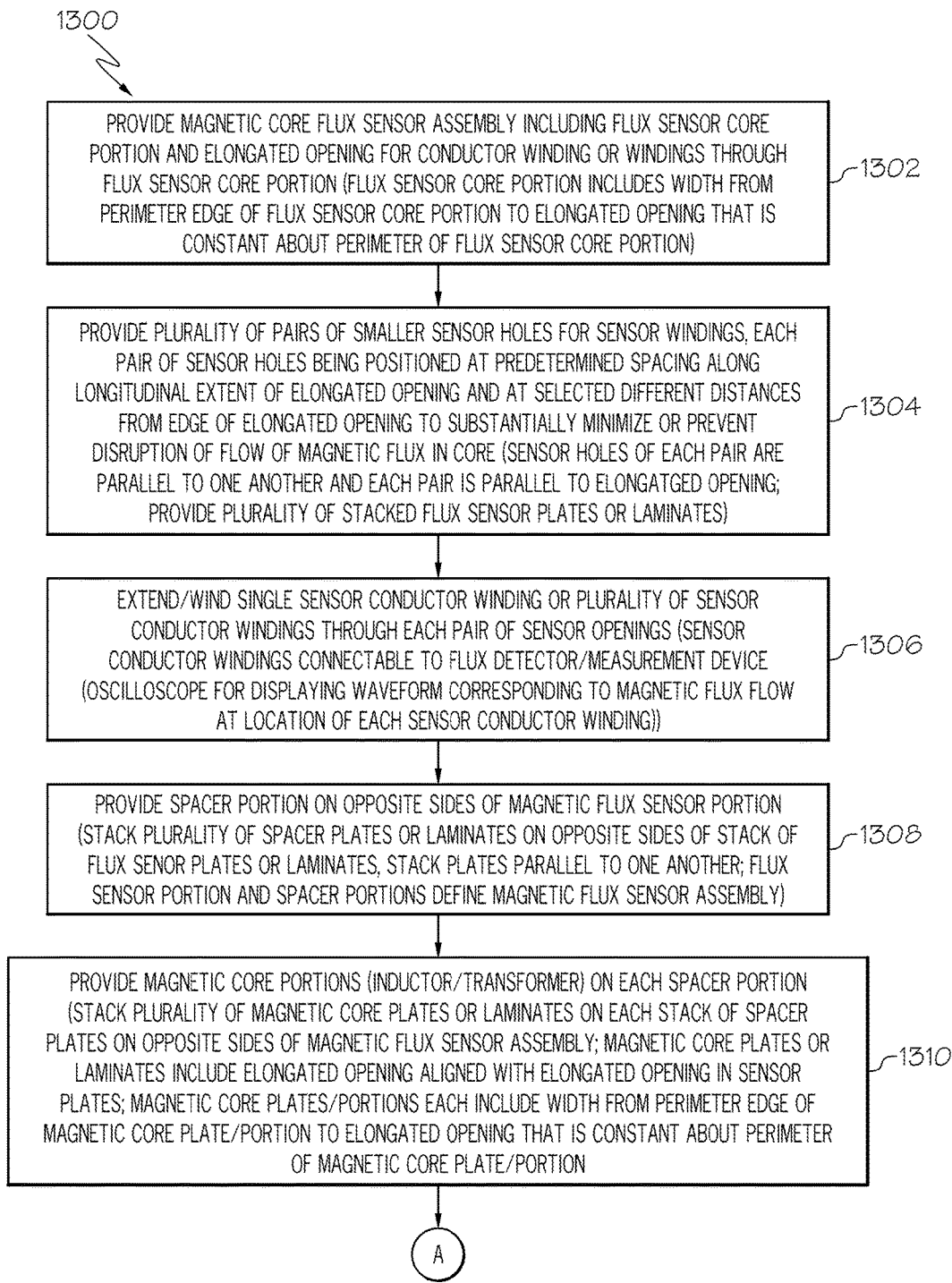
FIGS. 13A and 13B (collectively FIG. 13) are a flow chart of an example of a method for detecting and measuring magnetic flux intensity in a core of an electromagnetic device in accordance with an embodiment of the present disclosure.
Figure 13B:
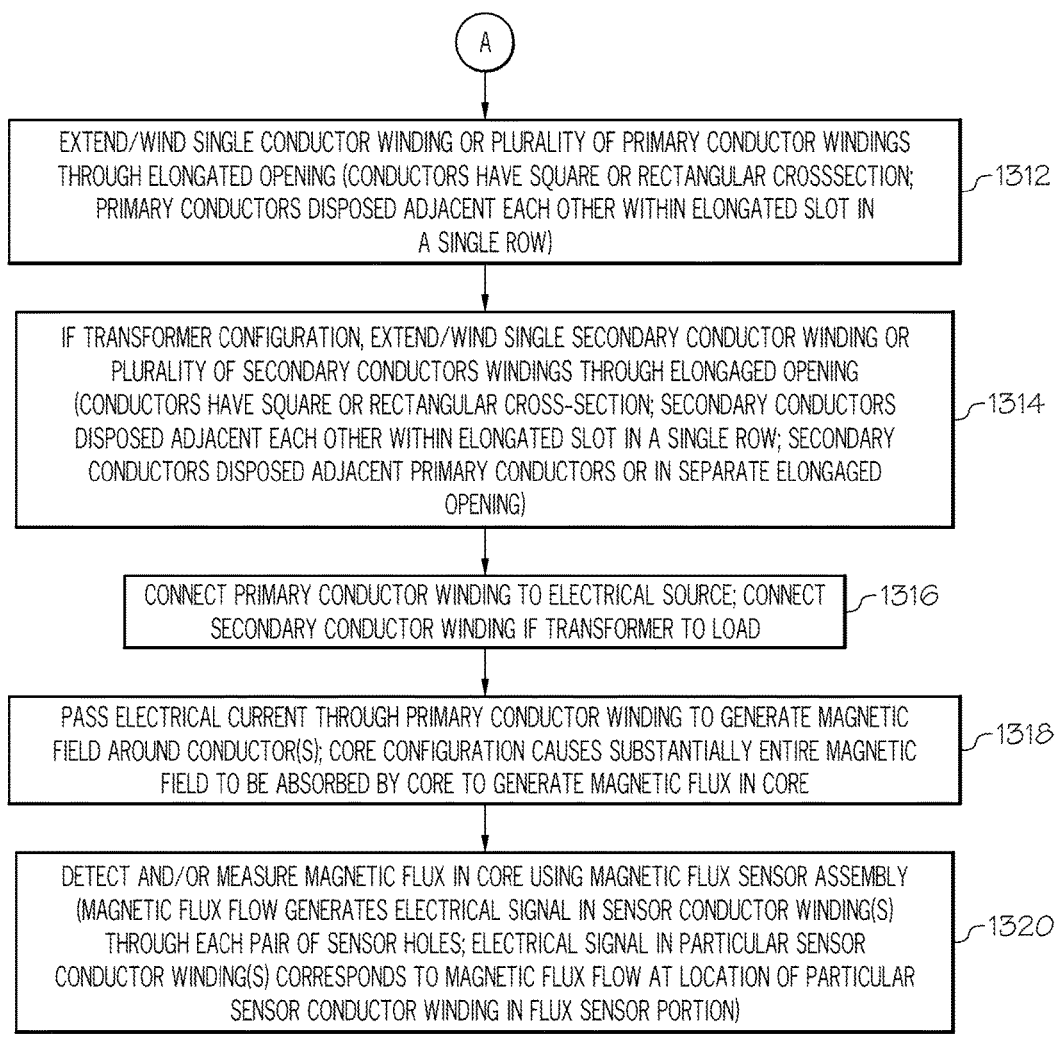

FIGS. 13A and 13B (collectively FIG. 13) are a flow chart of an example of a method 1300 for detecting and measuring magnetic flux intensity in a core of an electromagnetic device in accordance with an embodiment of the present disclosure. The method 1300 may be used by the flux sensor assembly 100 and electromagnetic devices 400, 600 and 1200 described with reference to FIGS. 1, 4A, 4B, 6A, 6B, 12A and 12B.

In block 1302, a magnetic core flux sensor assembly including a magnetic flux sensor core portion may be provided. The magnetic flux sensor core portion may include at least one elongated opening for a wire conductor winding or windings to extend through the magnetic flux sensor core portion. The flux sensor core portion may include a predetermined width from a perimeter edge of the flux sensor core portion to the elongated opening that is constant about the perimeter of the flux sensor core portion.

In block 1304, a plurality of pairs of sensor holes for sensor windings may be provided. The sensor holes may be elongated holes much smaller than the elongated opening for the conductor winding or windings. Each pair of sensor holes may be positioned at a predetermined spacing along a longitudinal extent of the elongated opening and at a selected different distance from an edge of the elongated opening to substantially minimize or prevent disruption of a flow of magnetic flux in a core of the electromagnetic device and to detect and/or measure a magnetic flux flow at the different distances from the elongated opening. The sensor holes of each pair may be parallel to one another and each pair of sensor holes may be parallel to the elongated opening. The flux sensor portion may include a plurality of flux sensor plates or laminates stacked on one another to form the flux sensor portion similar to that previously described.

In block 1306, a single sensor conductor or winding or a plurality of sensor conductors or windings may extend or wind through each pair of sensor openings. The sensor conductors or windings are connectable to a magnetic flux detector or flux measurement device. Similar that previously described the magnetic flux detector or flux measurement device may be an oscilloscope for displaying waveforms corresponding to the magnetic flux flow at a location of each sensor conductor winding through the sensor holes.

In block 1308, a spacer portion may be provided on opposite sides of the magnetic flux sensor portion. The spacer portion may be a stack of a plurality of spacer plates or laminates on opposite sides of a stack of flux sensor plates or laminates. The plates may be stacked parallel to one another similar to that previously described. The flux sensor portion and the spacer portions may define a magnetic flux sensor assembly.

In block 1310, magnetic core portions (inductor or transformer configuration) may be provided on each of the spacer portions. Similar to that previously described the core portions may include at least one elongated opening for the winding or windings. The inductor configuration will include a single winding or windings and the transformer configuration or assembly will include a primary winding and at least one secondary winding. The at least one elongated opening will align with the at least one opening in the sensor plates. Each magnetic core plate may include the predetermined width from a perimeter edge of the magnetic core plate to the elongated opening that is constant about the perimeter of the magnetic core plate. Accordingly, the each magnetic core portion includes the predetermined width from the perimeter edge of the magnetic core portion to the elongated opening when one or more magnetic core plates are stacked on one other with the elongated openings aligned to form the magnetic core portion.

In block 1312, a single conductor winding or a plurality of primary conductor windings may extend or wind through the at least one elongated opening. The conductors may have a substantially square or rectangular cross-section similar to that described in U.S. patent application Ser. No. 13/553, 267. The primary conductors may be disposed adjacent each other within the elongated opening or slot in a single row.

In block 1314, if the electromagnetic device is a transformer, a single secondary conductor winding or a plurality of secondary conductor windings may extend or wind through the elongated opening or may extend or wind through a second elongated opening. The secondary conductor windings may also have a square or rectangular cross-section. The secondary conductors may be disposed adjacent each other within the elongated opening or slot in a single row. The secondary conductors may be disposed adjacent the primary conductors in the same elongated opening, or in another embodiment, the secondary conductor windings may be in a separate elongated opening similar to that described in U.S. patent application Ser. No. 13/553, 267.

In block 1316, if the electromagnetic device is a transformer, the primary conductor winding or windings may be connected to an electrical source and the secondary conductor winding or windings may be connected to an output or a load.

In block 1318, an electrical current may be conducted through the primary conductor winding or windings to generate a magnetic field around the conductor or conductors of the primary winding. The core of the electromagnetic device may be designed to cause substantially the entire magnetic field to be absorbed by the core. A magnetic flux is generated in the core by the magnetic field.

In block 1320, the magnetic flux flow in the core may be detected and/or measured using a magnetic flux sensor assembly similar to that described herein. The magnetic flux flow generates an electrical signal in the sensor conductor winding or windings through each pair of sensor holes as described herein. The electrical signal in a particular sensor conductor winding corresponds to the magnetic flux flow at a location of the particular sensor conductor winding through the sensor holes.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the embodiments herein have other applications in other environments. This application is intended to cover any adaptations or variations of the present disclosure. The following claims are in no way intended to limit the scope of the disclosure to the specific embodiments described herein.

What is claimed is:

1. A magnetic core flux sensor assembly, comprising:
   a flux sensor core portion comprising a same magnetic material throughout;
   an elongated opening for receiving a conductor winding through the flux sensor core portion, an electrical current flowing through the conductor winding generates a magnetic field about the conductor winding and a magnetic flux flow about the elongated opening in the flux sensor core portion;
   a pair of sensor holes through the same magnetic material of the flux sensor core portion in a path of the magnetic flux flow in the same magnetic material of the flux sensor core portion and positioned relative to the elongated opening, the pair of sensor holes being configured for preventing significant disruption of the magnetic flux flow in the flux sensor core portion and for use in sensing the magnetic flux flow at a predetermined distance from the elongated opening; and
   a sensor conductor winding through the pair of sensor holes, the magnetic flux flow generating an electrical signal in the sensor conductor winding, the electrical signal in the sensor conductor winding corresponding to the magnetic flux flow at a location of the sensor conductor winding.

2. The magnetic flux sensor assembly of claim 1, further comprising a plurality of sensor holes through the same magnetic material of the flux sensor core portion in a path of the magnetic flux flow in the same magnetic material and positioned relative to the elongated opening, the plurality of pairs of sensor holes being configured for preventing significant disruption of the magnetic flux flow in the flux sensor core and for use in sensing the magnetic flux flow at different distances from the elongated opening, wherein the plurality of pairs of sensor holes are each consecutively spaced along a longitudinal side of the elongated opening and with each consecutive pair of sensor holes at an increasing distance from an edge of the longitudinal side of the elongated opening.

3. The magnetic flux sensor assembly of claim 2, wherein the plurality of consecutive pairs of sensor holes are spaced at a predetermined distance from one another along the longitudinal side of the elongated opening.

4. The magnetic flux sensor assembly of claim 3, wherein a first sensor hole of each pair of sensor holes is closer to the longitudinal side of the elongated opening than a second sensor hole of each pair of sensor holes.

5. The magnetic flux sensor assembly of claim 2, wherein a first sensor hole of a first pair of sensor holes is at a selected distance from the edge of the elongated opening, a distance of a first sensor hole of each consecutive pair of sensor holes increasing in distance from the edge of the elongated opening by about half the selected distance.

6. The magnetic flux sensor assembly of claim 5, wherein the first sensor hole and a second sensor hole of each pair of sensor holes are separated by the selected distance, the second sensor hole being the selected distance farther from the longitudinal edge of the elongated opening than the first sensor hole of each pair of sensor holes.

7. The magnetic flux sensor assembly of claim 2, wherein each of the sensor holes is an elongated hole parallel to the elongated opening.

8. The magnetic flux sensor assembly of claim 1, wherein the flux sensor core portion comprises:
   two opposite sides each parallel to longitudinal sides of the elongated opening between the two opposite sides; and
   a semicircular end at each end of the flux sensor core portion that joins the two opposite sides, the constant width of the flux sensor core portion providing a consistent core cross-sectional area for a magnetic circuit.

9. The magnetic flux sensor assembly of claim 8, further comprising a gap between the elongated opening and the perimeter edge of the flux sensor core portion.

10. The magnetic flux sensor assembly of claim 8, wherein the flux sensor core portion comprises a plurality of flux sensor core plates stacked on one another, the elongated opening and the pair of sensor holes being formed in each flux sensor core plate.

11. The magnetic flux sensor assembly of claim 10, further comprising a spacer portion disposed on each outside flux sensor core plate, the spacer portion comprising an opening, the conductor winding passing through the spacer portion opening.

12. An electromagnetic device, comprising:
a magnetic core portion; and
an elongated opening for receiving a conductor winding through the magnetic core portion, an electrical current flowing through the conductor winding generates a magnetic field about the conductor winding and a magnetic flux flow about the elongated opening in the magnetic core portion;
a flux sensor core portion comprising a same magnetic material, wherein the elongated opening extends through the flux sensor core portion for receiving the conductor winding through the flux sensor core portion, the electrical current flowing through the conductor winding generates a magnetic field about the conductor winding and a magnetic flux flow about the elongated opening in the flux sensor core portion, the flux sensor core portion further comprising:
a pair of sensor holes through the same magnetic material of the flux sensor core portion in a path of the magnetic flux flow in the same magnetic material and positioned relative to the elongated opening, the pair of sensor holes being configured for preventing significant disruption of the magnetic flux flow in the flux sensor core portion and for use in sensing the magnetic flux flow at a predetermined distance from an edge of the elongated opening; and
a sensor conductor winding through the pair of sensor holes, the magnetic flux flow generating an electrical signal in the sensor conductor winding, the electrical signal in a the sensor conductor winding corresponding to the magnetic flux flow at a location of the sensor conductor winding.

13. The electromagnetic device of claim 12, wherein the magnetic core portion comprises:
two opposite sides that are each parallel to longitudinal sides of the elongated opening between the two opposite sides; and
a semicircular end at each end of the magnetic core portion that joins the two opposite sides.

14. The electromagnetic device of claim 12, wherein the magnetic core portion comprises a first magnetic core portion and a second magnetic core portion, the electromagnetic device further comprising:
a first spacer portion and second spacer portion respectively disposed on opposite sides of the flux sensor core portion, each spacer portion comprising an opening, the conductor winding passing through the spacer portion opening; and
wherein the first magnetic core portion is disposed on the first spacer portion and the second magnetic core portion is disposed on the second spacer portion, at least one of the spacer portions comprising a gap for the sensor conductor winding through the pair of sensor holes to pass to connect to a device for detecting the magnetic flux flow at the location of the sensor conductor winding.

15. An electromagnetic device, comprising a first magnetic core assembly, the first magnetic core assembly comprising:
a flux sensor core portion;
an elongated opening for receiving a primary conductor winding and a secondary conductor winding through the flux sensor core portion, wherein the flux sensor core portion comprises a predetermined width from a perimeter edge of the flux sensor core portion to the elongated opening that is constant about a perimeter of the flux sensor core portion, an electrical current flowing through the primary conductor winding generates a magnetic field about the primary conductor winding and a magnetic flux flow about the elongated opening in the flux sensor core portion;
a pair of sensor holes positioned relative to the elongated opening, the pair of sensor holes being configured for preventing significant disruption of the magnetic flux flow in the flux sensor core portion and for use in sensing the magnetic flux flow at a predetermined distance from an edge of the elongated opening;
a sensor conductor winding through the pair of sensor holes, the magnetic flux flow generating an electrical signal in the sensor conductor winding, the electrical signal in the sensor conductor winding corresponding to the magnetic flux flow at a location of the sensor conductor winding;
a first spacer portion and a second spacer portion each respectively disposed on opposite sides of the flux sensor core portion, each spacer portion comprising an opening, the primary conductor winding and the secondary conductor winding passing through each spacer portion opening;
a first magnetic core portion disposed on the first spacer portion; and
a second magnetic core portion disposed on the second spacer portion, wherein the elongated opening extends through the first and second magnetic core portions, the primary conductor winding and the secondary conductor winding each extending through the first and second magnetic core portions, each magnetic core portion comprising the predetermined width from a perimeter edge of the magnetic core portion to the elongated opening that is constant about a perimeter of the magnetic core portion, and wherein at least one of the spacer portions comprises a gap for the sensor conductor winding through the pair of sensor holes to pass to connect to a device for detecting the magnetic flux flow at the location of the sensor conductor winding.

16. The electromagnetic device of claim 15, wherein the flux sensor core portion and each magnetic core portion each comprise:
two opposite sides that are each parallel to longitudinal sides of the elongated opening between the two opposite sides; and
a semicircular end at each end of the flux sensor core portion and each magnetic core portion that joins the two opposite sides, wherein the two opposite sides and semicircular ends of each of the flux sensor core portion and each magnetic core portion align with each other when stacked to form the electromagnetic device; and wherein each spacer portion comprises two opposite sides and a semicircular end at each end of the spacer portion that joins the two opposite sides of the spacer portion, the two opposite sides and semicircular ends of each spacer portion aligning with the two opposite sides and semicircular ends of the flux sensor core portion and each magnetic core portion when stacked to form the electromagnetic device.

17. The electromagnetic device of claim 15, further comprising a second magnetic core assembly, the second magnetic core assembly comprising:
a flux sensor core portion;
an elongated opening for receiving a primary conductor winding and a secondary conductor winding through the flux sensor core portion, wherein the flux sensor core portion comprises a predetermined width from a perimeter edge of the flux sensor core portion to the elongated opening that is constant about a perimeter of the flux sensor core portion, an electrical current flowing through the primary conductor winding generates a magnetic field about the primary conductor winding and a magnetic flux flow about the elongated opening in the flux sensor core portion;
a pair of sensor holes positioned relative to the elongated opening, the pair of sensor holes being configured for preventing significant disruption of the magnetic flux flow in the flux sensor core portion and for use in sensing the magnetic flux flow at a predetermined distance from an edge of the elongated opening;
a sensor conductor winding through the pair of sensor holes, the magnetic flux flow generating an electrical signal in the sensor conductor winding, the electrical signal in the sensor conductor winding corresponding to the magnetic flux flow at a location of the sensor conductor winding;
a first spacer portion and a second spacer portion each respectively disposed on opposite sides of the flux sensor core portion, each spacer portion comprising an opening, the primary conductor winding and the secondary conductor winding passing through the spacer portion opening; and
a first magnetic core portion disposed on the first spacer portion; and
a second magnetic core portion disposed on the second spacer portion, wherein the elongated opening extends through the first and second magnetic core portions, the primary conductor winding and the secondary conductor winding each extending through the first and second magnetic core portions, each magnetic core portion comprising the predetermined width from a perimeter edge of the magnetic core portion to the elongated opening that is constant about a perimeter of the magnetic core portion, and wherein at least one of the spacer portions comprises a gap for the sensor conductor winding through the pair sensor holes to pass to connect to a device for detecting the magnetic flux flow at the location of the sensor conductor winding.

18. A method for measuring a magnetic flux in an electromagnetic device, comprising:
providing a magnetic core flux sensor assembly comprising a flux sensor core portion and an elongated opening for receiving a conductor winding through the flux sensor core portion, an electrical current flowing through the conductor winding generates a magnetic field about the conductor winding and a magnetic flux flow about the elongated opening in the flux sensor core portion, the flux sensor core portion comprising a same magnetic material throughout;
providing a pair of sensor holes through the same magnetic material of the magnetic core flux sensor in a path of the magnetic flux flow in the same magnetic material and positioned relative to the elongated opening, the pair of sensors holes being configured for preventing significant disruption of the magnetic flux flow in the flux sensor core portion and for use in sensing the magnetic flux flow at a predetermined distance from an edge of the elongated opening; and
providing a sensor conductor winding through the pair of sensor holes, the magnetic flux flow generating an electrical signal in each sensor conductor winding, the electrical signal in the sensor conductor winding corresponding to the magnetic flux flow at a location of the sensor conductor winding.

19. The method of claim 18, further comprising providing a plurality of pairs of sensor holes, wherein providing the plurality of pairs of sensor homes comprises:
spacing each of the plurality of pairs of sensor holes consecutively along a longitudinal side of the elongated opening; and
spacing each consecutive pair of sensor holes at an increased distance from an edge of the longitudinal side of the elongated opening.

20. The method of claim 18, wherein providing the magnetic core flux sensor assembly comprises providing the flux sensor core portion comprising:
two opposite sides each parallel to longitudinal sides of the elongated opening between the two opposite sides; and
a semicircular end at each end of the flux sensor core portion that joins the two opposite sides, the constant width of the flux sensor core portion providing a consistent core cross-sectional area for a magnetic circuit.

* * * * *